US006426270B1

(12) United States Patent
Sakaguchi et al.

(10) Patent No.: US 6,426,270 B1
(45) Date of Patent: Jul. 30, 2002

(54) SUBSTRATE PROCESSING METHOD AND METHOD OF MANUFACTURING SEMICONDUCTOR SUBSTRATE

(75) Inventors: Kiyofumi Sakaguchi; Kazuaki Ohmi; Kazutaka Yanagita, all of Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/495,646

(22) Filed: Feb. 1, 2000

(30) Foreign Application Priority Data

Feb. 2, 1999 (JP) .......................................... 11-025483

(51) Int. Cl.[7] .............................................. H01L 21/76
(52) U.S. Cl. ........................ 438/406; 438/455; 438/459
(58) Field of Search ................................ 438/406, 455, 438/459

(56) References Cited

U.S. PATENT DOCUMENTS

| | | | | |
|---|---|---|---|---|
| 5,250,460 A | * | 10/1993 | Yamagata et al. | 438/455 |
| 5,466,631 A | * | 11/1995 | Ichikawa et al. | 438/406 |
| 5,543,648 A | * | 8/1996 | Miyawaki | 438/455 |
| 5,811,348 A | * | 9/1998 | Matsushita et al. | 438/455 |
| 5,856,229 A | * | 1/1999 | Sakaguchi et al. | 438/406 |
| 5,866,468 A | * | 2/1999 | Kono et al. | 438/406 |
| 5,869,387 A | * | 2/1999 | Sato et al. | 438/455 |
| 5,937,312 A | * | 8/1999 | Iyer et al. | 438/455 |
| 5,985,681 A | * | 11/1999 | Hamajima et al. | 438/406 |
| 6,030,884 A | * | 2/2000 | Mori | 438/406 |
| 6,103,598 A | * | 8/2000 | Yamagata et al. | 438/459 |
| 6,121,112 A | * | 9/2000 | Sakaguchi et al. | 438/406 |
| 6,143,628 A | * | 11/2000 | Sato et al. | 438/455 |

FOREIGN PATENT DOCUMENTS

| | | |
|---|---|---|
| JP | 5-021338 | 1/1993 |
| JP | 7-302889 | 11/1995 |
| JP | 11-297583 | 10/1999 |
| JP | 11-307413 | 11/1999 |

OTHER PUBLICATIONS

Imai et al., *Journal of Crystal Growth*, "Crystalline Quality of Silicon Layer Formed by FIPOS technology", vol. 63, 547 (1983).

A. Uhlir, *Bell System Technical Journal*, "Electrolytic Shaping of Germanium and Silicon", vol. 35, 333 (1956).

T. Unagami, *Journal of Electrochemical Society*, "Formation Mechanism of Porous Silicon Layer by Anodization in HF Solution", vol. 127, 476 no date.

Nagano et al., *IEICE Technical Report*, "Oxidized Porous Silicon and It's Application", vol. 79, SSD79–9549 (1979).

K. Imai, *Solid State Electronics*, "A New Dielectric Isolation Method Using Porous Silicon", vol. 24, 159 (1981).

R. P. Holmstrom and J.Y. Chi, *Applied Phys. Letter*, "Complete Dielectric Isolation By Highly Selective and Self–Stopping Formation of Oxidized Porous Silicon", vol. 42, 386 (1983).

K. Mitani Technical Challenges in High Volumn Unibond SOI Wafer Manufacturing Silicon–On–Insulator Technology 1998.*

S. Wolf Silicon Processing for the VSLI Era vol. 1 Lattice Press 1986 p. 1.*

S. Wolf Silicon Processing for the VSLI Era vol. 2 Lattice Press 1990 pp. 508–510.*

"Applied Physics", vol. 66, No. 11, pp. 1220–1224 (1997): "Future Evolution of a Stuck SOI wafer" (with its partial translation).

A Notification from Japanese Patent Office (Japanese version) no date.

* cited by examiner

*Primary Examiner*—Olik Chaudhuri
*Assistant Examiner*—David S. Blum
(74) *Attorney, Agent, or Firm*—Morgan & Finnegan, L.L.P.

(57) ABSTRACT

In a method of bonding first and second substrates to prepare a bonded substrate stack and then separating the bonded substrate stack at a porous layer to manufacture an SOI substrate, planarization of the first substrate after separation and reuse of the first substrate are facilitated. First, an insulating layer remaining at the outer peripheral portion of a first substrate after separation is selectively removed, and then, a porous layer on a single-crystal Si substrate is selectively removed.

39 Claims, 10 Drawing Sheets

SUBSTRATE PROCESSING METHOD AND METHOD OF MANUFACTURING SEMICONDUCTOR SUBSTRATE

BACKGROUND OF THE INVENTION

1. Field of the Invention

The present invention relates to a substrate processing method and method of manufacturing a semiconductor substrate and, more particularly, to a processing method of processing a used first substrate that remains after a bonded substrate stack is formed by bonding a first substrate having a separation layer and a transfer layer on the separation layer to a second substrate, and the bonded substrate stack is separated mainly at the separation layer to transfer a partial region of the transfer layer to the second substrate, and a method of manufacturing a semiconductor substrate using the processing method.

2. Description of the Related Art

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A complete depletion type field effect transistor can be formed by thin film formation.

Since an SOI structure has the above various advantages, researches have been made on its formation method for several decades.

As one SOI technology, the SOS (Silicon On Sapphire) technology by which Si is heteroepitaxially grown on a single-crystal sapphire substrate by CVD (Chemical Vapor Deposition) has been known for a long time. This SOS technology once earned a reputation as the most matured SOI technology. However, the SOS technology has not been put into practical use to date because, e.g., a large amount of crystal defects are produced by lattice mismatch in the interface between the Si layer and the underlying sapphire substrate, aluminum that forms the sapphire substrate mixes in the Si layer, the substrate is expensive, and it is difficult to obtain a large area.

Attempts have recently been made to realize the SOI structure without using any sapphire substrate. The attempts are roughly classified into two methods.

In the first method, the surface of a single-crystal Si substrate is oxidized, and a window is formed in the oxide film ($SiO_2$ layer) to partially expose the Si substrate. Single-crystal Si is epitaxially grown laterally using the exposed portion as a seed, thereby forming a single-crystal Si layer on $SiO_2$ (in this method, an Si layer is deposited on an $SiO_2$ layer).

In the second method, a single-crystal Si substrate itself is used as an active layer, and an $SiO_2$ layer is formed on the lower surface of the substrate (in this method, no Si layer is deposited).

As a means for realizing the first method, a method of directly epitaxially growing single-crystal Si in the horizontal direction from the single-crystal Si layer by CVD (CVD), a method of depositing amorphous Si and epitaxially growing single-crystal Si laterally in the solid phase by annealing (solid phase epitaxial growth), a method of irradiating an amorphous silicon layer or a polysilicon layer with a focused energy beam such as an electron beam or laser beam to grow a single-crystal Si layer on an $SiO_2$ layer by melting recrystallization (beam annealing), or a method of scanning band-shaped melting regions by a rod-like heater (zone melting recrystallization) is known.

All of these methods have both advantages and disadvantages and many problems of controllability, productivity, uniformity, and quality, and therefore have not been put into practical use in terms of industrial applications. For example, CVD requires sacrifice oxidation to form a flat thin film. Solid phase epitaxial growth is poor in crystallinity. In beam annealing, the process time required to scan the focused beam and controllability for beam superposition or focal point adjustment pose problems. Zone melting recrystallization is the most matured technique, and relatively large-scaled integrated circuits have been fabricated on a trial basis. However, since a number of crystal defects such as a subboundary undesirably remain, minority carrier devices cannot be created.

As the above second method, i.e., as the method without using the Si substrate as a seed for epitaxial growth, the following four techniques can be used.

As the first technique, an oxide film is formed on a single-crystal Si substrate having a V-shaped groove formed in the surface by anisotropic etching. A polysilicon layer having nearly the same thickness as that of the single-crystal Si substrate is deposited on the oxide film. After this, the single-crystal Si substrate is polished from the lower surface, thereby forming, on the thick polysilicon layer, a substrate having a single-crystal Si region surrounded and dielectrically isolated by the V-shaped groove. With this technique, a substrate having satisfactory crystallinity can be formed. However, there are problems of controllability and productivity in association with the process of depositing polysilicon as thick as several hundred micron or the process of polishing the single-crystal Si substrate from the lower surface to leave the isolated Si active layer.

The second technique is SIMOX (Separation by Ion Implanted Oxygen). In this technique, oxygen ions are implanted into a single-crystal Si substrate to form an $SiO_2$ layer. In this technique, to form an $SiO_2$ layer in a substrate, oxygen ions must be implanted at a dose of $10^{16}$ (ions/cm$^2$) or more. This implantation takes a long time to result in low productivity and high manufacturing cost. In addition, since a number of crystal defects are generated, the quality is too low to manufacture minority carrier devices.

As the third technique, an SOI structure is formed by dielectric isolation by oxidizing a porous Si layer. In this technique, an n-type Si island is formed on the surface of a p-type single-crystal Si substrate by proton ion implantation (Imai et al., J. Crystal Growth, vol. 63, 547 (1983)) or epitaxial growth and patterning. This substrate is anodized in an HF solution to convert only the p-type Si substrate around the n-type Si island into a porous structure. After this, the n-type Si island is dielectrically isolated by accelerated oxidation. In this technique, since the Si region to be isolated must be determined before the device process, the degree of freedom in device design is limited.

As the fourth technique, an SOI structure is formed by bonding a single-crystal Si substrate to another thermally oxidized single-crystal Si substrate by annealing or an adhesive. In this technique, an active layer for forming a device must be uniformly thin. More specifically, a single-crystal Si substrate having a thickness of several hundred micron must be thinned down to the micron order or less.

To thin the substrate, polishing or selective etching can be used.

A single-crystal Si substrate can hardly be uniformly thinned by polishing. Especially, in thinning to the submicron order, the variation range is several ten %. As the wafer size becomes large, this difficulty becomes more pronounced.

Selective etching is effective to uniformly thin the substrate. However, the selectivity ratio is as low as about $10^2$, the surface planarity after etching is poor, and the crystallinity of the SOI layer is unsatisfactory.

A transparent substrate represented by a glass substrate is important in forming a contact sensor as a light-receiving element or a projection liquid crystal display device. To realize highly precise pixels (picture elements) having higher density and resolution for the sensor or display device, a high-performance driving element is required. For this purpose, a demand has arisen for a technique of forming a single-crystal Si layer having excellent crystallinity on a transparent substrate.

However, when an Si layer is deposited on a transparent substrate represented by a glass substrate, only an amorphous Si layer or a polysilicon layer is obtained. This is because the transparent substrate has an amorphous crystal structure, and the Si layer formed on the substrate reflects the disorderliness of the crystal structure of the transparent substrate.

The present applicant has disclosed a new SOI technology in Japanese Patent Laid-Open No. 5-21338. In this technique, a first substrate obtained by forming a porous layer on a single-crystal Si substrate and a non-porous single-crystal layer on its surface is bonded to a second substrate via an insulating layer. After this, the bonded substrate stack is separated into two substrates at the porous layer, thereby transferring the non-porous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred-Å to 10-μmn thick SOI films can be manufactured by a single manufacturing apparatus.

Porous Si was found in 1956 by Uhlir et al. who were studying electropolishing of semiconductors (A. Uhlir, Bell Syst. Tech. J., vol. 35, 333 (1956)). Porous Si can be formed by anodizing an Si substrate in an HF solution.

Unagami et al. studied the dissolution reaction of Si upon anodizing and reported that holes were necessary for anodizing reaction of Si in an HF solution, and the reaction was as follows (T. Unagami, J. Electrochem. Soc., vol. 127, 476 (1980)).

$$Si+2HF+(2-n)e^+ \rightarrow SiF_2+2H^+ +ne^-$$

$$SiF_2+2HF \rightarrow SiF_4+H_2$$

$$SiF_4+2HF \rightarrow H_2SiF_6$$

or $$Si+4HF+(4-\lambda)e^+ \rightarrow SiF_4+4H^+ +\lambda e^-$$

$$SiF_4+2HF \rightarrow H_2SiF_6$$

where $e^+$ and $e^-$ represent a hole and an electron, respectively, and n and λ are the number of holes necessary to dissolve one Si atom. According to them, when n>2 or λ>4, porous Si is formed.

The above fact suggests that p-type Si having holes is converted into porous Si while n-type Si is not converted. The selectivity in this conversion has been reported by Nagano et al. and Imai (Nagano, Nakajima, Anno, Onaka, and Kajiwara, IEICE Technical Report, vol. 79, SSD79-9549 (1979)), (K. Imai, Solid-State Electronics, vol. 24, 159 (1981)).

However, it has also been reported that n-type at a high concentration is converted into porous Si (R. P. Holmstrom and J. Y. Chi, Appl. Phys. Lett., vol. 42, 386 (1983)). Hence, it is important to select a substrate which can be converted into a porous Si substrate independently of p- or n-type.

To form a porous layer, in addition to anodization, ions may be implanted into a silicon substrate.

An SOI substrate is formed using a normal single-crystal Si substrate or the like as a material, and the manufacturing cost is higher than that of a normal single-crystal Si substrate.

This also applies to the method described in Japanese Patent Laid-Open No. 5-21338, i.e., the method in which a substrate (to be referred to as a bonded substrate stack hereinafter) obtained by bonding a first substrate having a non-porous layer such as a single-crystal Si layer on a porous layer to a second substrate via an insulating layer is separated at the porous layer, thereby transferring the non-porous layer formed on the first substrate side to the second substrate.

In consideration of this situation, the present applicant has also disclosed, in Japanese Patent Laid-Open No. 7-302889, a technique of bonding first and second substrates, separating the first substrate from the second substrate without breaking the first substrate, smoothing the surface of the separated first substrate, forming a porous layer again on the first substrate, and reusing this substrate. Since the first substrate is not wasted, this technique is advantageous in largely reducing the manufacturing cost and simplifying the manufacturing process.

For example, for the method disclosed in Japanese Patent Laid-Open No. 7-302889, a demand for an efficient method of planarizing the surface of the separated first substrate has arisen.

Mitsuya has reported in "Silicon-on-Insulator Manufacturing Technology, H-10" of "SEMICON WEST 98" that after separation of a substrate formed by bonding first and second substrates, a step difference of 0.3 μm is present in the periphery, and to planarize the surface of the first substrate by polishing in this state, the surface of the first substrate must be polished by 1 μm or more.

SUMMARY OF THE INVENTION

It is an object of the present invention to easily planarize a used first substrate that remains after a bonded substrate stack is formed by bonding a first substrate having a separation layer and a transfer layer on the separation layer to a second substrate, and the bonded substrate stack is separated mainly at the separation layer to transfer a partial region of the transfer layer to the second substrate, whereby reuse of the first substrate is facilitated.

According to the first aspect of the present invention, there is provided a substrate processing method of processing a used first substrate that remains after a bonded substrate stack is formed by bonding a first substrate having a separation layer and a transfer layer on the separation layer to a second substrate, and the bonded substrate stack is separated mainly at the separation layer to transfer a partial region of the transfer layer to the second substrate, comprising the transfer layer removal step of removing the transfer layer remaining on the used first substrate, and the separation layer removal step of removing the separation layer remaining on a surface of the used first substrate.

In the processing method according to the first aspect of the present invention, for example, the transfer layer removal step preferably comprises selectively removing the transfer layer remaining on an upper surface of the used first substrate.

In the processing method according to the first aspect of the present invention, for example, the transfer layer remaining on the used first substrate is preferably present at least an outer peripheral portion of an upper surface of the first substrate.

In the processing method according to the first aspect of the present invention, for example, the transfer layer remaining on the used first substrate is preferably present at least an outer peripheral portion and edge portion of an upper surface of the first substrate.

In the processing method according to the first aspect of the present invention, for example, the transfer layer remaining on the used first substrate is preferably present at least an outer peripheral portion and edge portion of upper and lower surfaces of the first substrate.

In the processing method according to the first aspect of the present invention, for example, the transfer layer remaining on the used first substrate is preferably present at least an outer peripheral portion and edge portion of an upper surface and on a lower surface of the first substrate.

In the processing method according to the first aspect of the present invention, preferably, for example, the transfer layer sequentially has a first layer and a second layer on the separation layer, and the transfer layer removal step comprises the first step of removing the second layer remaining on the used first substrate, and the second step of removing the first layer remaining on the used first substrate.

In the processing method according to the first aspect of the present invention, for example, the transfer layer preferably includes a semiconductor layer.

In the processing method according to the first aspect of the present invention, for example, the transfer layer preferably includes an Si layer.

In the processing method according to the first aspect of the present invention, for example, the transfer layer preferably includes a single-crystal Si layer.

In the processing method according to the first aspect of the present invention, preferably, for example, the first layer is a single-crystal Si layer, and the second layer is an $SiO_2$ layer.

In the processing method according to the first aspect of the present invention, for example, the transfer layer preferably includes at least one of a Ge layer, an SiGe layer, an SiC layer, and a C layer.

In the processing method according to the first aspect of the present invention, for example, the transfer layer preferably includes a compound semiconductor layer.

In the processing method according to the first aspect of the present invention, for example, the separation layer is preferably a porous layer.

In the processing method according to the first aspect of the present invention, for example, the first substrate preferably has, as the separation layer, a porous layer obtained by anodizing a surface of a single-crystal Si substrate, and the transfer layer on the porous layer.

In the processing method according to the first aspect of the present invention, for example, the first substrate preferably has, as the separation layer, a porous layer obtained by implanting ions into a single-crystal Si substrate, and the transfer layer on the porous layer.

In the processing method according to the first aspect of the present invention, for example, the first substrate is preferably prepared by forming the separation layer and the transfer layer on an Si substrate.

In the processing method according to the first aspect of the present invention, for example, the second substrate is preferably one of an Si substrate, an Si substrate having an oxide film, a transparent substrate, and an insulating substrate.

In the processing method according to the first aspect of the present invention, for example, the transfer layer removal step preferably comprises etching the transfer layer remaining on the used first substrate using a solution containing hydrofluoric acid.

In the processing method according to the first aspect of the present invention, for example, the first step preferably comprises etching the single-crystal Si layer as the first layer using one of hydrofluoric acid and buffered hydrofluoric acid.

In the processing method according to the first aspect of the present invention, for example, the second step preferably comprises etching the $SiO_2$ layer as the second layer using a solution mixture of hydrofluoric acid, acetic acid, and nitric acid.

In the processing method according to the first aspect of the present invention, for example, the transfer layer removal step preferably comprises etching the transfer layer remaining on the used first substrate by dry etching.

In the processing method according to the first aspect of the present invention, for example, the separation layer removal step preferably comprises selectively removing the separation layer.

In the processing method according to the first aspect of the present invention, for example, the separation layer removal step preferably comprises selectively removing the separation layer by wet etching.

In the processing method according to the first aspect of the present invention, for example, as an etchant, one material selected from the group consisting of 1) hydrofluoric acid, 2) a solution mixture prepared by adding at least one of an alcohol and hydrogen peroxide to hydrofluoric acid, 3) buffered hydrofluoric acid, and 4) a solution mixture prepared by adding at least one of an alcohol and hydrogen peroxide to buffered hydrofluoric acid is preferably used.

In the processing method according to the first aspect of the present invention, for example, the separation layer removal step preferably comprises selectively removing the separation layer by polishing.

The processing method according to the first aspect of the present invention preferably further comprises, e.g., the planarization step of planarizing an upper surface of the used first substrate after the separation layer removal step.

In the processing method according to the first aspect of the present invention, for example, the planarization step preferably comprises the step of annealing the upper surface of the used first substrate in an atmosphere containing hydrogen.

In the processing method according to the first aspect of the present invention, for example, the planarization step preferably comprises the step of planarizing the upper surface of the used first substrate by polishing.

According to the second aspect of the present invention, there is provided a substrate processing method of processing a used substrate that remains after a transfer layer of a substrate having a separation layer and the transfer layer on the separation layer is transferred to another object, comprising the transfer layer removal step of removing the transfer layer remaining on the used substrate, and the separation layer removal step of removing the separation layer remaining on a surface of the used substrate.

According to the third aspect of the present invention, there is provided a substrate processing method of removing a porous layer and other layers from a substrate having the porous layer and the other layers at an outer peripheral portion of the porous layer, comprising the steps of removing the other layers, and removing the porous layer.

According to the fourth aspect of the present invention, there is provided a method of manufacturing semiconductor substrates, comprising the preparation step of bonding a first substrate having a separation layer and, on the separation layer, a transfer layer including a semiconductor layer to an independently prepared second substrate to prepare a bonded substrate stack, the transfer step of separating the bonded substrate stack mainly at the separation layer to transfer a partial region of the transfer layer to a surface of the second substrate, thereby preparing a semiconductor substrate having the transfer layer on a surface, the transfer layer removal step of removing the transfer layer remaining on the first substrate after the transfer step, and the separation layer removal step of removing the separation layer remaining on the surface of the first substrate after the transfer layer removal step, wherein the semiconductor substrates are obtained while executing a series of processes of reusing the first substrate after the separation layer removal step as a material used to prepare a bonded substrate stack in the preparation step.

Further objects, features and advantages of the present invention will become apparent from the following detailed description of the embodiments of the present invention with reference to the accompanying drawings.

DETAILED DESCRIPTION OF THE PREFERRED EMBODIMENTS

Preferred embodiments of the present invention will be described below.

First Embodiment

A substrate manufacturing method and a method of recycling (processing) a substrate used in the manufacturing method according to the first embodiment of the present invention will be described.

FIGS. 1A to 1H are schematic views for explaining a substrate manufacturing method and a method of recycling a substrate used in the manufacturing method. In the step shown in FIG. 1A, a single-crystal Si substrate 11 is prepared, and a porous Si layer 12 is formed on the surface of the single-crystal Si substrate 11 by, e.g., anodizing.

Figure 1A:
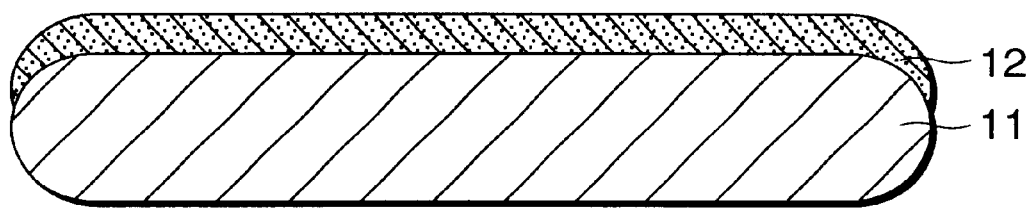
FIG. 1A is a schematic view for explaining the process of forming a porous layer in a substrate manufacturing method and a method of recycling a substrate used in the manufacturing method.
Figure 1B:
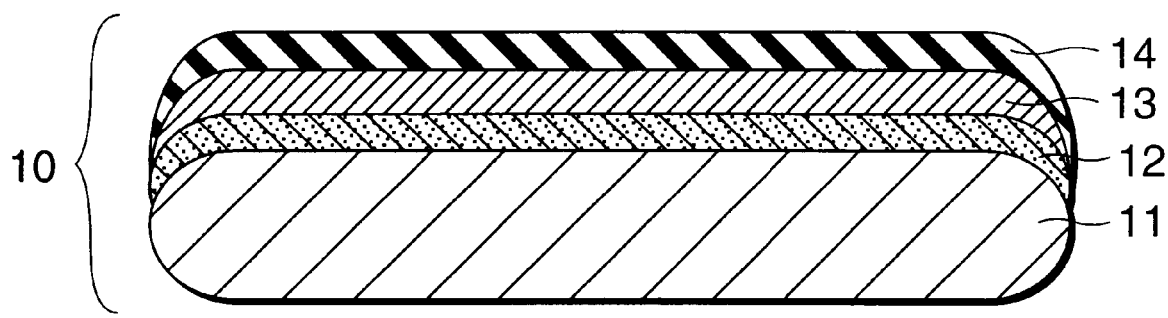
FIG. 1B is a schematic view for explaining the process of forming a single-crystal Si layer and insulating layer in the substrate manufacturing method and the method of recycling the substrate used in the manufacturing method.

In the step shown in FIG. 1B, a non-porous single-crystal Si layer 13 is formed on the porous Si layer 12 by epitaxial growth. The surface of the non-porous single-crystal Si layer 13 is oxidized to form an insulating layer ($SiO_2$) layer 14. With this process, a first substrate 10 is formed.

The porous Si layer 12 maybe formed by, e.g., a method of implanting ions of hydrogen, helium, or an inert gas into a single-crystal Si substrate, a single-crystal Si substrate having an epitaxial growth layer on its surface, or a single-crystal Si substrate annealed in $H_2$ (ion implantation). The porous Si layer formed by this method has a number of microcavities and is therefore called a microcavity layer. With this method, the non-porous single-crystal Si layer 13 is formed on the porous layer 12 simultaneously with formation of the porous layer 12. The $SiO_2$ layer 14 is preferably formed on the surface of the substrate 11 before ion implantation. This prevents surface roughness of the substrate 11.

Figure 1C:
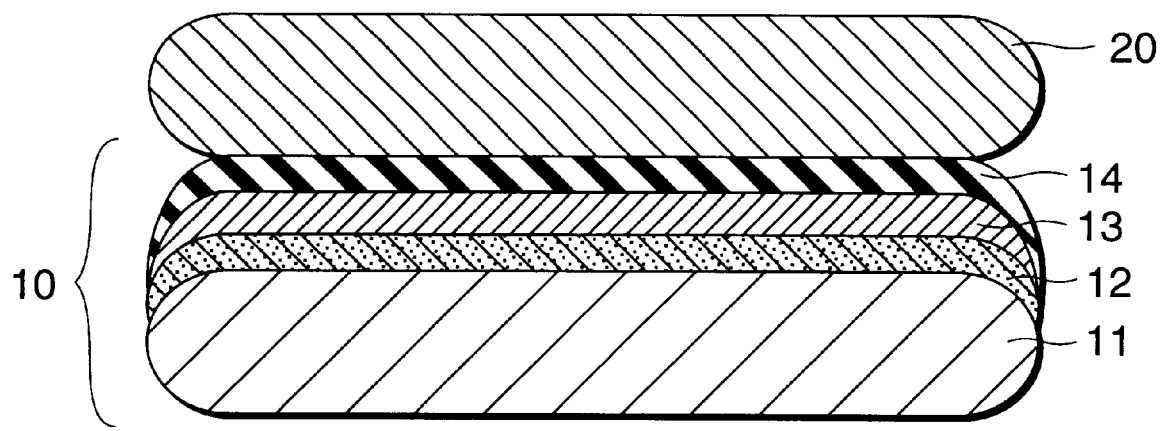
FIG. 1C is a schematic view for explaining the bonding process in the substrate manufacturing method and the method of recycling the substrate used in the manufacturing method.

In the step shown in FIG. 1C, a second substrate 20 of single-crystal Si is prepared and brought into tight contact with the first substrate 10 at room temperature while making the insulating layer 14 oppose the second substrate 20, thereby forming a bonded substrate stack. The insulating layer 14 may be formed on the single-crystal Si layer 13 side, on the second substrate 20, or on both single-crystal Si layer 13 and second substrate 20 as far as the state shown in FIG. 1C is obtained upon bringing the first and second substrates into tight contact with each other. However, when the insulating layer 14 is formed on the side of the single-crystal Si layer 13 serving as an active layer, the bonding interface between the first substrate 10 and the second substrate 20 can be apart from the active layer. For this reason, an SOI substrate having a higher quality can be obtained.

Figure 1D:
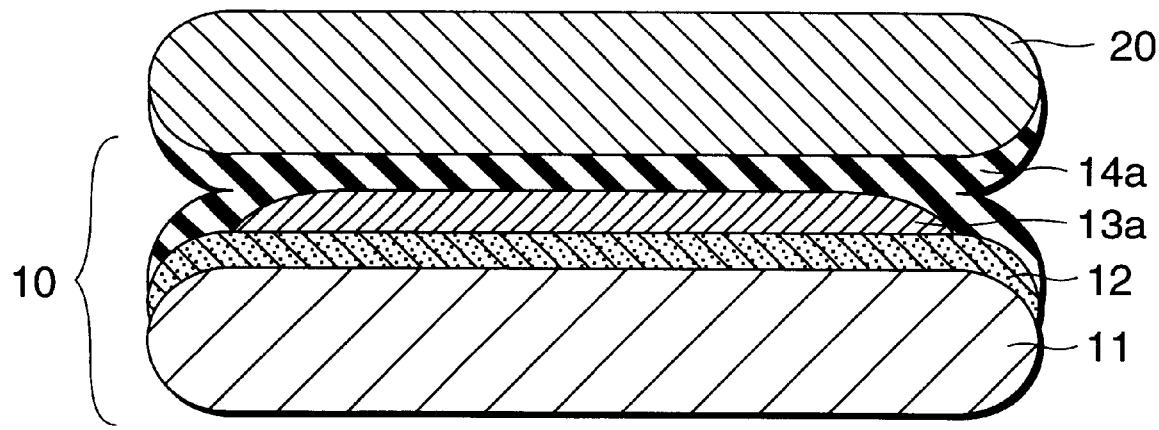
FIG. 1D is a schematic view for explaining the oxidation process in the substrate manufacturing method and the method of recycling the substrate used in the manufacturing method.

In the step shown in FIG. 1D, at least the peripheral portion of the bonded substrate stack shown in FIG. 1C is oxidized. With this process, the insulating layer ($SiO_2$ layer) covers the outer peripheral portion of the bonded substrate stack, and the outer peripheral edge of the single-crystal Si layer 13 retreats toward the inside of the bonded substrate stack. Reference numeral 13a denotes a single-crystal Si layer after oxidation; and 14a, an insulating layer after oxidation. This oxidation process is not always necessary. However, when oxidation is performed, defects in the subsequent separation process (FIG. 1E) can be effectively prevented.

Figure 1E:
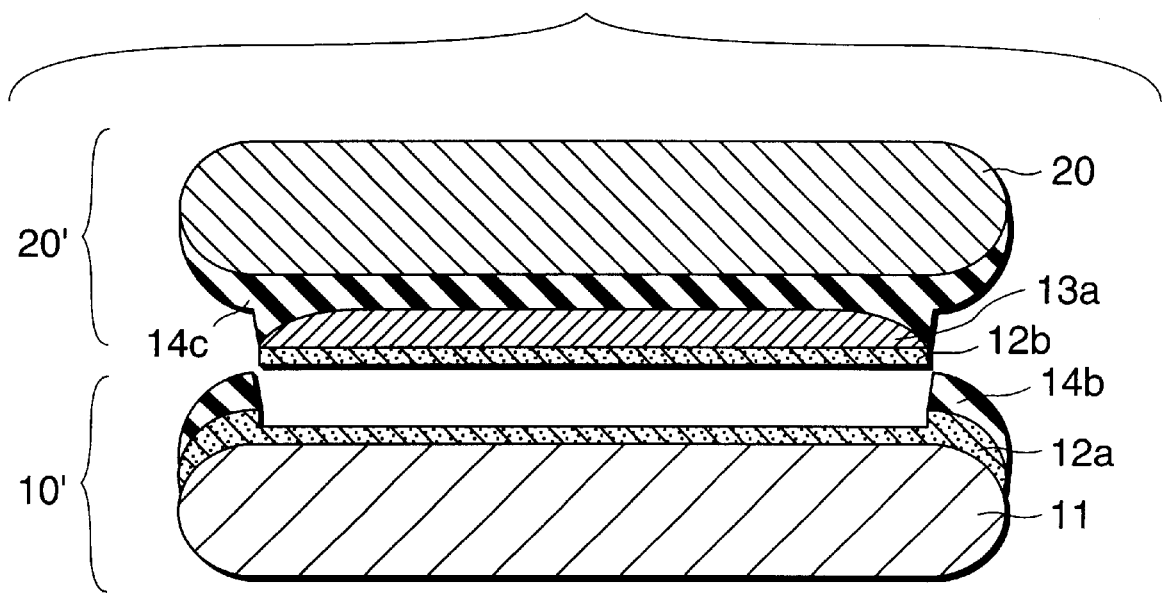
FIG. 1E is a schematic view for explaining the separation process in the substrate manufacturing method and the method of recycling the substrate used in the manufacturing method.

In the step shown in FIG. 1E, the bonded substrate stack after oxidation (FIG. 1D) is separated into two substrates at the porous layer 12. As a separating method, for example, the following methods are preferable.
(1) Separation Using Fluid A stream of fluid (e.g., a liquid such as water or a gas such as air or nitrogen) is ejected to the gap at the outer peripheral portion of a bonded substrate stack to separate the bonded substrate stack into two substrates at the porous layer 12 by the fluid.
(2) Separation Using Wedge When a thin wedge of, e.g., a resin is gradually inserted into the gap at the outer peripheral portion of a bonded substrate stack, the bonded substrate stack is separated into two substrates at the porous layer 12.
(3) Separation by Peeling One surface of a bonded substrate stack is fixed, and the other surface is pulled in the axial direction of the bonded substrate stack using a flexible tape or the like, thereby separating the bonded substrate stack at the porous layer.
(4) Separation Using Shearing Stress One surface of a bonded substrate stack is fixed, and a force is applied to the other surface to move the other surface in the planar direction of the bonded substrate stack, thereby separating the bonded substrate stack at the porous layer by shearing stress.
(5) Separation by Expanding Porous Layer When the porous layer 12 is oxidized from the outer peripheral portion at a high speed to expand the porous layer, the bonded substrate stack is separated into two substrates at the porous layer 12.

(6) Separation Using Ultrasonic Wave

A bonded substrate stack is dipped in a liquid, and an ultrasonic wave is applied to the bonded substrate stack through the liquid to break the porous layer 12, thereby separating the bonded substrate stack into two substrates at the porous layer 12.
(7) Separation By Pressing Pressure is applied to a bonded substrate stack to break the porous layer 12, thereby separating the bonded substrate stack into two substrates at the porous layer 12.

With the separation process shown in FIG. 1E, a second substrate 20' after separation has a multilayered structure of a porous Si layer 12b/single-crystal Si layer 13a/insulating layer 14c/single-crystal Si substrate 20. A first substrate 10' after separation has a structure in which a porous layer 12a is formed on the single-crystal Si substrate 11, and an insulating layer 14b formed at the outer peripheral portion on the porous layer 12a.

With the above process, part of the single-crystal Si layer 13 and insulating layer 14 (a portion excluding the outer peripheral portion) on the porous layer 12 of the first substrate can be transferred to the second substrate. The porous layer 12 is an example of a separation layer, and the single-crystal Si layer 13 and insulating layer 14 are an example of transfer layers transferred from the first substrate to the second substrate.

Figure 1F:
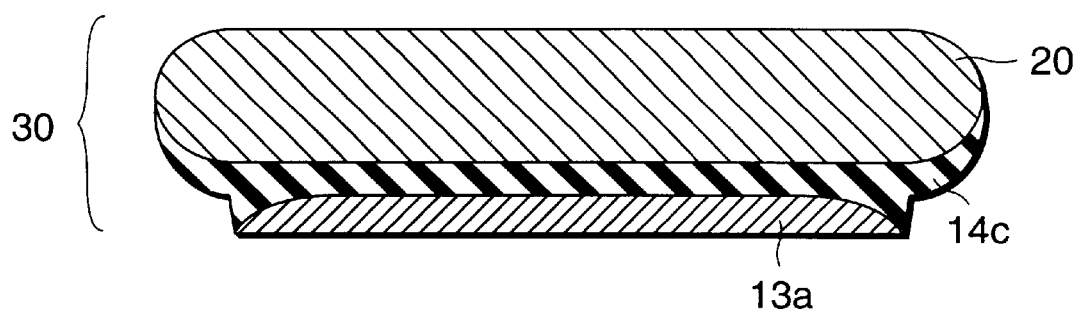
FIG. 1F is a schematic view for explaining the process of removing the porous layer and the structure of an SOI substrate in the substrate manufacturing method and the method of recycling the substrate used in the manufacturing method.

In the step shown in FIG. 1F, the porous layer 12b on the surface of the second substrate 20' after separation is selectively removed. With this process, an SOI substrate 30 having a multilayered structure of a single-crystal Si layer 13a/insulating layer 14c/single-crystal Si substrate 20, i.e., an SOI structure can be obtained, as shown in FIG. 1F.

Figure 1G:
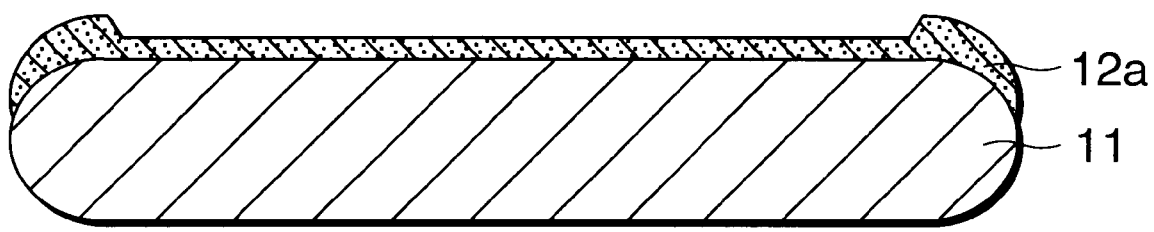
FIG. 1G is a schematic view for explaining the first removal process (insulating layer removal process) in the substrate manufacturing method and the method of recycling the substrate used in the manufacturing method.

In the step shown in FIG. 1G, the first removal process of removing an unnecessary layer on the single-crystal Si substrate 11 of the first substrate 10' after separation is executed. More specifically, in the step shown in FIG. 1G, the insulating layer 14b remaining at the outer peripheral portion of the first substrate 10' after separation is removed. The insulating layer 14b is preferably selectively removed with respect to the porous layer 12a.

The first removal process preferably employs, e.g., wet etching using an $SiO_2$ etchant (e.g., hydrofluoric acid or buffered hydrofluoric acid) having selectivity to porous Si or dry etching using an $SiO_2$ etching gas having selectivity to porous Si.

Even when dry etching is employed, the same effect (selectivity) as that of wet etching can be obtained by adjusting the gas species, pressure, power, and discharge matching. According to dry etching, the insulating layer at the outer peripheral portion can be selectively etched even by controlling the distribution of the etching rates in the plane of the substrate.

Figure 1H:
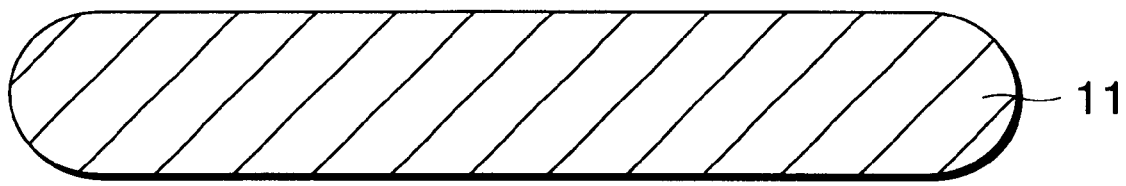
FIG. 1H is a schematic view for explaining the second removal process (porous layer removal process) in the substrate manufacturing method and the method of recycling the substrate used in the manufacturing method.

In the step shown in FIG. 1H, the second removal process of removing an unnecessary layer on the single-crystal Si substrate 11 is executed. More specifically, in the step shown in FIG. 1H, the porous Si layer 12a remaining on the single-crystal Si substrate 11 is selectively removed. The second removal process preferably employs, e.g., wet etching using a porous Si etchant (e.g., a solution mixture of 49% hydrofluoric acid, 30% hydrogen peroxide, and water). In the second removal process, the porous Si layer 12a may be removed by, e.g., polishing.

The resultant single-crystal Si substrate 11 can be used again as a substrate used to form a first substrate 10, or a second substrate 20.

As described above, after the bonded substrate stack is separated into two substrates at the porous layer, the insulating layer 14b remaining at the outer peripheral portion of the first substrate 10' after separation is removed in the first removal process. With this process, a substrate having high surface planarity can be obtained after the subsequent second removal process. More specifically, when the first removal process is executed, only the porous layer 12a need be selectively removed with respect to the underlying single-crystal Si substrate 11 in the second removal process. For this reason, the porous layer 12a can be removed while maintaining the surface planarity of the single-crystal Si substrate 11.

The SOI substrate manufacturing method and first substrate recycling method have been described above. As the semiconductor layer 13 to be transferred from the first substrate to the second substrate, not the single-crystal Si layer but another Si layer such as a polysilicon layer or an amorphous Si layer may be formed. Alternatively, a Ge layer, SiGe layer, SiC layer, C layer, or a compound semiconductor (e.g., GaAs, InP, or GaN) layer may be formed. That is, the above SOI substrate manufacturing method and first substrate recycling method can also be applied to methods of manufacturing various semiconductor substrates and methods of recycling the first substrate.

As the second substrate, not only a single-crystal Si substrate but also an Si substrate having an oxide film on its surface, an insulating substrate (e.g., a quartz substrate or sapphire substrate), or a transparent substrate (e.g., a quartz substrate or sapphire substrate) can be preferably used.

In the above embodiment, the insulating layer remains only at the outer peripheral portion on the porous layer of the first substrate after separation. However, the present invention can also be applied to a case wherein the insulating layer remains at a portion other than the outer peripheral portion.

The insulating layer remains at a portion other than the outer peripheral portion, e.g., when a defect is generated in the separation process. At a portion with a effect, the single-crystal Si layer of the second substrate (SOI substrate) after separation breaks. However, according to the above method, no problem is posed in recycling the first substrate after separation.

Figure 4:
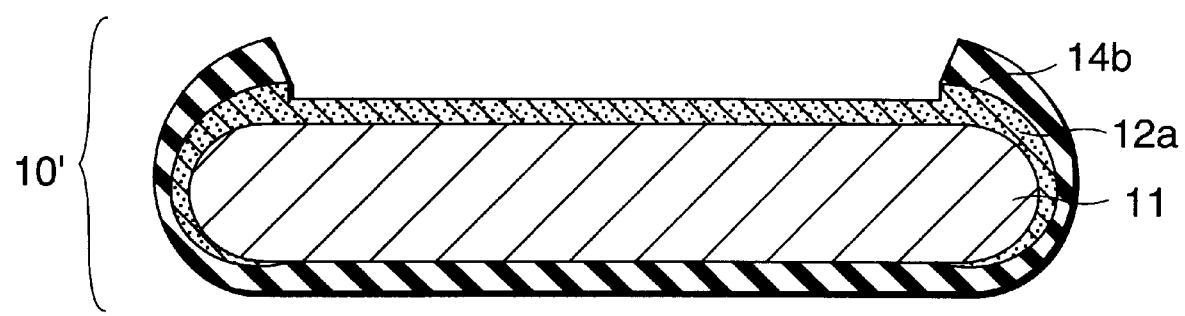
FIG. 4 is a view showing an example of a second substrate which can be reused by applying the first embodiment of the present invention.

The present invention can also be applied to a case wherein the insulating layer remains not only at the outer peripheral portion on the surface of the second substrate after separation but also, e.g., at the edge portion and/or at the outer peripheral portion on the lower surface and/or on the entire lower surface. FIG. 4 is a view showing an example of the second substrate after separation that can be reused by applying the first embodiment.

Second Embodiment

This embodiment is different from the first embodiment in the structure of a bonded substrate stack obtained by bonding first and second substrates and oxidizing them. Accordingly, the first substrate recycling method is also different from that of the first embodiment.

In the substrate manufacturing method and the method of recycling (processing) a substrate used in the manufacturing method according to the second embodiment, the process until a first substrate 10 and second substrate 20 are bonded is the same as shown in FIGS. 1A to 1C in the first embodiment. The process after the first substrate 10 and second substrate 20 are bonded will be described below.

FIGS. 2A to 2F are schematic views for explaining the substrate manufacturing method and the method of recycling a substrate used in the manufacturing method. After a bonded substrate stack is formed by bonding the first substrate 10 to the second substrate 20 in the step shown in FIG. 1C, at least the outer peripheral portion of the bonded substrate stack is oxidized in the step shown in FIG. 2A.

In this oxidation process, at the outer peripheral portion of the bonded substrate stack, it is oxidized such that a porous layer 12 is oxidized and thinned, and the outer peripheral portion of the bonded substrate stack is covered with an insulating layer (SiO$_2$ layer). That is, in this embodiment, the bonded substrate stack is oxidized within the range where the multilayered structure of the porous layer 12, a single-crystal Si layer 13a', and an insulating layer 14a' is maintained.

In the first embodiment, the outer peripheral edge of the single-crystal Si layer 13 retreats toward the inside in oxidation, and the insulating layer (SiO$_2$ layer) is directly stacked on the porous layer at the outer peripheral portion, as described above.

This oxidation process is not always necessary. However, when oxidation is performed, defects in the subsequent separation process (FIG. 2B) can be effectively prevented.

Figure 2A:
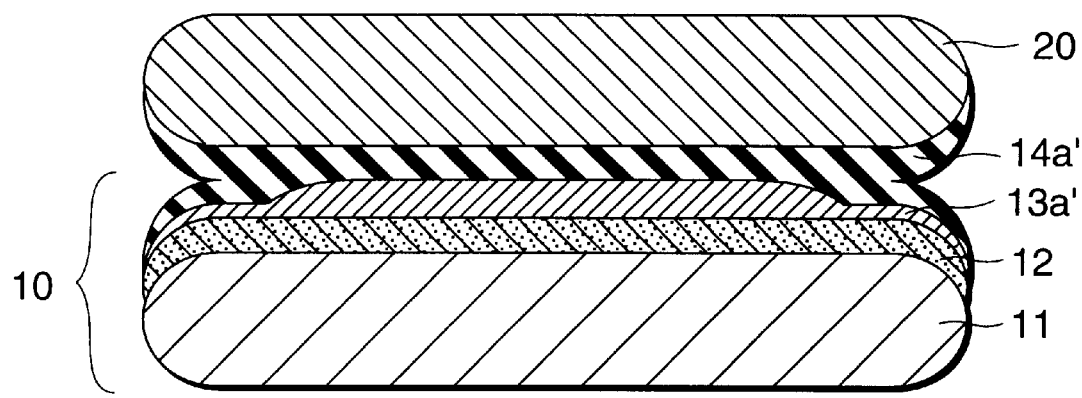
FIG. 2A is a schematic view for explaining the oxidation process in a substrate manufacturing method and a method of recycling a substrate used in the manufacturing method.
Figure 2B:
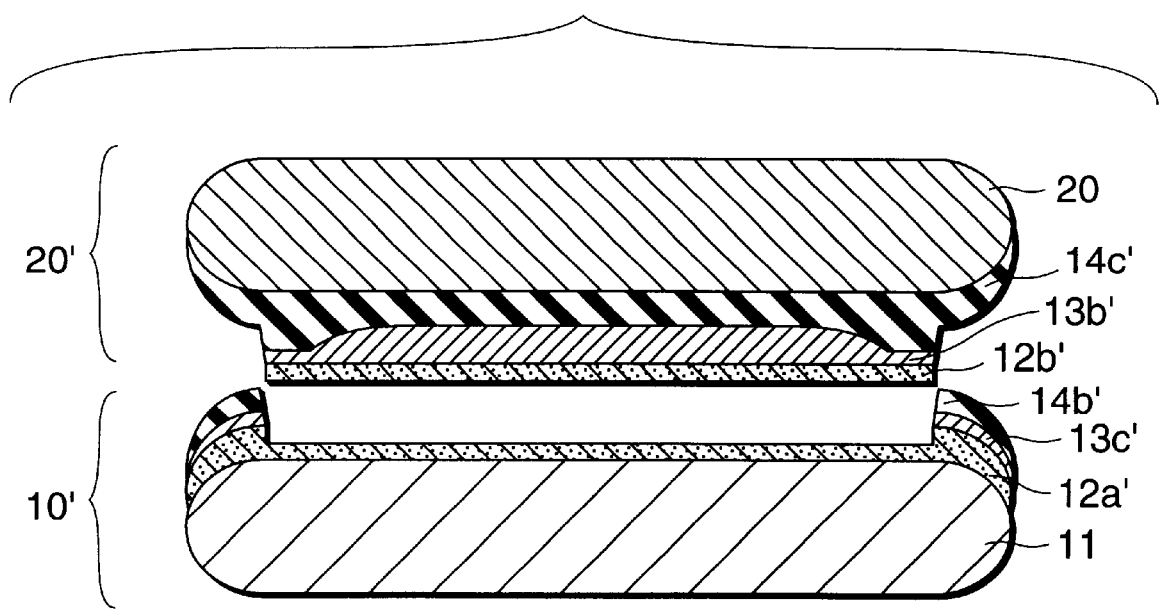
FIG. 2B is a schematic view for explaining the separation process in the substrate manufacturing method and the method of recycling the substrate used in the manufacturing method.

In the step shown in FIG. 2B, the bonded substrate tack after oxidation (FIG. 2A) is separated into two substrates at the porous layer 12. As the separating method, the methods described in the first embodiment are preferable.

With the separation process shown in FIG. 2B, a second substrate 20' after separation has a multilayered structure of a porous Si layer 12b'/single-crystal Si layer 13b'/insulating layer 14c'/single-crystal Si substrate 20. A first substrate 10' after separation has a structure in which a porous layer 12a' is formed on the single-crystal Si substrate 11, and a single-crystal Si layer 13c' and insulating layer 14b' are sequentially formed at the outer peripheral portion on the porous layer 12a'. With the above process, part of the single-crystal Si layer 13 and insulating layer 14 (a portion excluding the outer peripheral portion) on the porous layer 12 of the first substrate can be transferred to the second substrate. The porous layer 12 is an example of a separation layer, and the single-crystal Si layer 13 and insulating layer 14 are an example of transfer layers transferred from the first substrate to the second substrate.

Figure 2C:
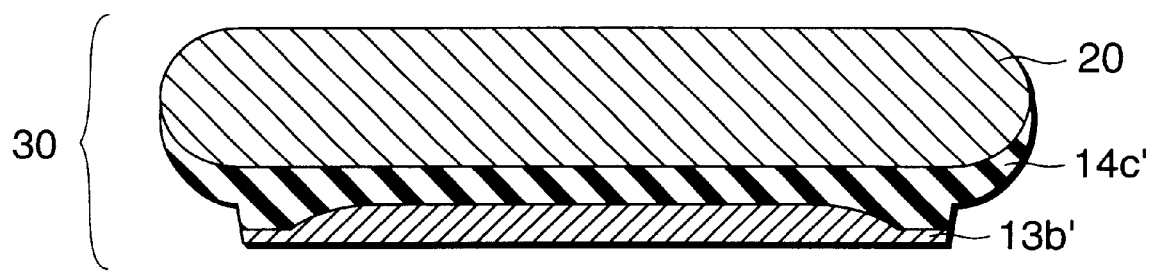
FIG. 2C is a schematic view for explaining the process of removing a porous layer and the structure of an SOI substrate in the substrate manufacturing method and the method of recycling the substrate used in the manufacturing method.

In the step shown in FIG. 2C, the porous layer 12b' on the surface of the second substrate 20' after separation is selectively removed. With this process, an SOI substrate 30 having a multilayered structure of a single-crystal Si layer 13b'/insulating layer 14c'/single-crystal Si substrate 20, i.e., an SOI structure can be obtained, as shown in FIG. 2C.

Figure 2D:
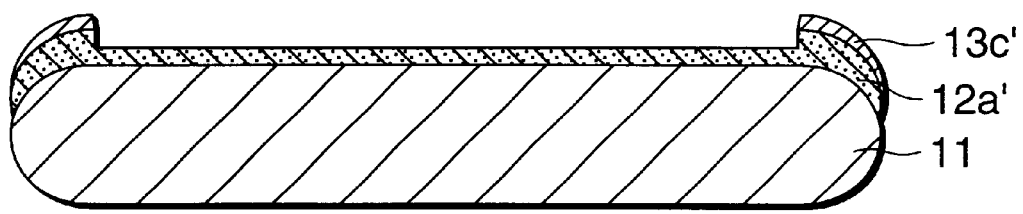
FIG. 2D is a schematic view for explaining the first removal process (insulating layer removal process) in the substrate manufacturing method and the method of recycling the substrate used in the manufacturing method.

In the step shown in FIG. 2D, the first removal process of removing an unnecessary layer on the single-crystal Si substrate 11 of the first substrate 10' after separation is executed. More specifically, in the step shown in FIG. 2D, the insulating layer 14b' remaining at the outer peripheral portion of the first substrate 10' after separation is removed. The insulating layer 14b' is preferably selectively removed with respect to the porous layer 12a'.

The first removal process preferably employs, e.g., wet etching using an SiO$_2$ etchant (e.g., hydrofluoric acid or buffered hydrofluoric acid) having selectivity to porous Si or dry etching using an SiO$_2$ etching gas having selectivity to porous Si.

Figure 2E:
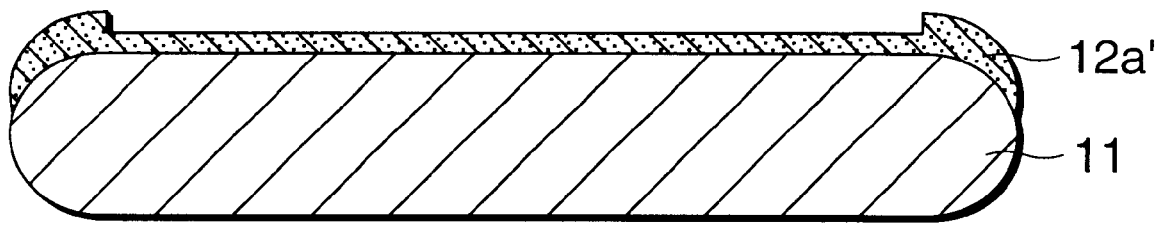
FIG. 2E is a schematic view for explaining the second removal process (single-crystal Si layer removal process) in the substrate manufacturing method and the method of recycling the substrate used in the manufacturing method.

In the step shown in FIG. 2E, the second removal process is executed. More specifically, the single-crystal Si layer 13c' at the outer peripheral portion of the substrate after removal of the insulating layer 14c' at the outer peripheral portion is removed. In the second removal process, the single-crystal Si layer 13c' at the outer peripheral portion is removed using, e.g., a solution mixture of hydrofluoric acid, nitric acid, and acetic acid as an etchant (mixing ratio=

1:100:100). Since the single-crystal Si layer 13c' and porous Si layer 12a' are formed from the same material, the porous Si layer 12a' is also etched in wet-etching the single-crystal Si layer 13c'.

However, when the porous Si layer 12 is formed in the step shown in FIG. 1A such that the porous Si layer 12a' with an appropriate thickness remains, the influence of etching of the porous Si layer 12a' can be neglected. For example, a fact has been confirmed that when the thickness of the single-crystal Si layer 13c' at the outer peripheral portion of the bonded substrate stack is 0.2 μm, and the single-crystal Si layer 13c' is completely removed using the solution mixture of hydrofluoric acid, nitric acid, and acetic acid, the thickness at the central portion of the porous Si layer 12a' decreases by only 0.3 μm at maximum.

At least one of the first removal process (insulating layer removal process) and second removal process (single-crystal Si layer removal process) can effectively use dry etching. Even when dry etching is employed, the same effect as that of wet etching can be obtained by adjusting the gas species, pressure, power, and discharge matching. According to dry etching, the insulating layer and/or single-crystal Si layer at the outer peripheral portion can be selectively etched by controlling the distribution of the etching rate in the plane of the substrate.

Figure 2F:
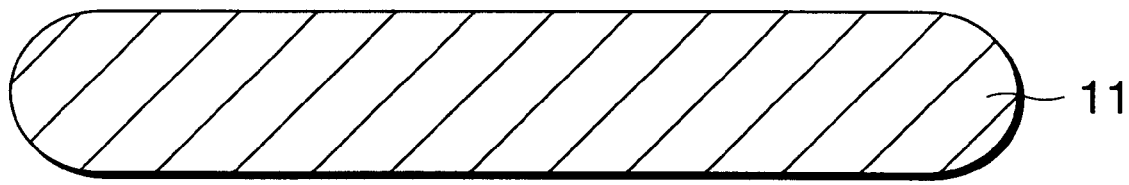
FIG. 2F is a schematic view for explaining the third removal process (porous layer removal process) in the substrate manufacturing method and the method of recycling the substrate used in the manufacturing method.

In the step shown in FIG. 2F, the third removal process of removing an unnecessary layer on the single-crystal Si substrate 11 is executed. More specifically, in the step shown in FIG. 2F, the porous Si layer 12a' remaining on the single-crystal Si substrate 11 is selectively removed. The third removal process preferably employs, e.g., wet etching using an echant for porous Si (e.g., a solution mixture of 49% hydrofluoric acid, 30% hydrogen peroxide, and water). In the third removal process, the porous Si layer 12a' may be removed by, e.g., polishing.

The resultant single-crystal Si substrate 11 can be used again as a substrate used to form a first substrate 10, or a second substrate 20.

As described above, after the bonded substrate stack is separated into two substrates at the porous layer, the insulating layer 14b remaining at the outer peripheral portion of the first substrate 10' after separation is removed in the first removal process, and the single-crystal Si layer 13c' remaining at the outer peripheral portion of the substrate is removed in the second removal process. With this process, a substrate having high surface planarity can be obtained after the subsequent third removal process. More specifically, when the first and second removal processes are executed, only the porous layer 12a' need be selectively removed with respect to the underlying single-crystal Si substrate 11 in the third removal process. For this reason, the porous layer 12a' can be removed while maintaining the surface planarity of the single-crystal Si substrate 11.

The SOI substrate manufacturing method and method of recycling the first substrate have been described above. As the semiconductor layer 13 to be transferred from the first substrate to the second substrate, not the single-crystal Si layer but a Ge layer, SiGe layer, SiC layer, C layer, or a compound semiconductor (e.g., GaAs, InP, or GaN) layer may be employed. That is, the above SOI substrate manufacturing method and first substrate recycling method can also be applied to methods of manufacturing various semiconductor substrates and methods of recycling the first substrate.

As the second substrate, not only a single-crystal Si substrate but also an insulating substrate (e.g., a quartz substrate) or a transparent substrate (e.g., a quartz substrate) can be preferably used.

In the above embodiment, the insulating layer and single-crystal Si layer remain only at the outer peripheral portion on the porous layer of the first substrate after separation. However, the present invention can also be applied to a case wherein the insulating layer and single-crystal Si layer remain at a portion other than the outer peripheral portion.

The insulating layer and single-crystal Si layer remain at a portion other than the outer peripheral portion, e.g., when a defect is generated in the separation process. At a portion with a defect, the single-crystal Si layer of the second substrate (SOI substrate) after separation breaks. However, according to the above method, no problem is posed in recycling the first substrate after separation.

Figure 5:
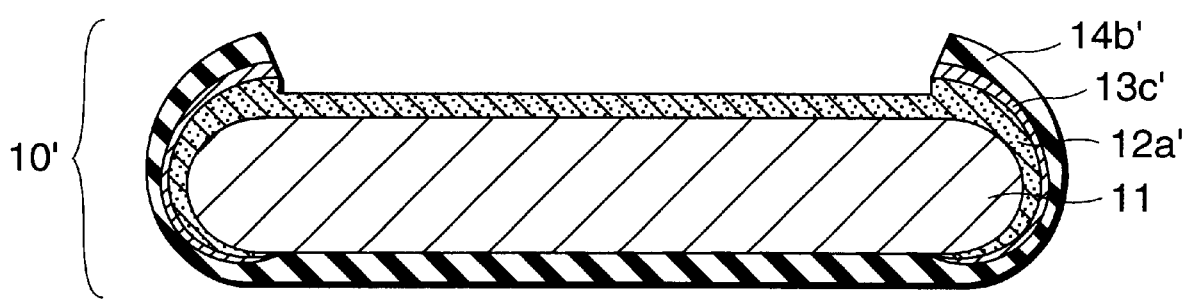
FIG. 5 is a view showing an example of a second substrate which can be reused by applying the second embodiment of the present invention.

The present invention can also be applied to a case wherein the insulating layer and/or single-crystal Si layer remains not only at the outer peripheral portion on the surface of the second substrate after separation but also, e.g., at the edge portion and/or at the outer peripheral portion on the lower surface and/or on the entire lower surface. FIG. 5 is a view showing an example of the second substrate after separation that can be reused by applying the second embodiment.

EXAMPLES

Specific examples of the above embodiments will be described below.

Example 1

Example 1 provides a specific example of the first embodiment.

First, to form a first substrate 10, an 8-inch single-crystal Si substrate 11 was prepared. The single-crystal Si substrate 11 was anodized in an HF Solution to form a porous layer 12 on the surface (FIG. 1A). The anodizing conditions were as follows.

<Anodizing Conditions>

Current density: 7 (mA/cm$^2$)

Anodizing solution: HF:H$_2$O:C$_2$H$_5$OH=1:1:1

Process time: 11 (min)

Porous Si thickness: 12 (μm)

A 0.15-μm thick single-crystal Si layer 13 was epitaxially grown on the porous Si layer 12 by CVD (Chemical Vapor Deposition) (FIG. 1B). The growth conditions were as follows. At the early stage of epitaxial growth, the surface of the porous Si layer 12 was exposed to H$_2$. Hence, holes on the surface were filled to form a flat surface.

<Epitaxial Growth Conditions>

Source gas: SiH$_2$Cl$_2$/H$_2$

Gas flow rate: 0.5/180 (1/min)

Gas pressure: 80 (Torr)

Temperature: 950 (° C.)

Growth rate: 0.30 (μm/min)

A 100-nm thick SiO$_2$ layer 14 was formed on the surface of the epitaxially grown single-crystal Si layer 13 by thermal oxidation (FIG. 1B).

The surface of the SiO$_2$ layer 14 was brought into tight contact with the surface of an independently prepared 8-inch Si substrate (second substrate) 20 to form a bonded substrate stack (FIG. 1C). The bonded substrate stack was thermally oxidized at 1,100° C. for 1 hr (FIG. 1D).

With this thermal oxidation, the outer peripheral portion of the single-crystal Si layer 13 was oxidized, and the outer peripheral edge retreated to the inside of the bonded substrate stack. In addition, an oxide film was formed at the outer peripheral portion of the bonded substrate stack. At the outer peripheral portion of the first substrate 10 (e.g., a portion about 1 mm from the outer peripheral edge toward the inside), the porous layer 12 was formed on the single-crystal Si substrate 11, and an insulating layer 14a was formed on the porous layer 12. The outer peripheral edge of the contact interface between the first substrate 10 and the second substrate 20 was located inward from the outer peripheral edge of the bonded substrate stack by about 1 mm.

The bonded substrate stack after thermal oxidation was separated into two substrates at the porous layer 12 (FIG. 1E). As a separating method, for example, the following methods were preferable.

(1) Separation by Water Jet Method

A water jet having a diameter of, e.g., about 0.2 mm was ejected to the gap at the outer peripheral portion of the bonded substrate stack, thereby separating the bonded substrate stack into two substrates at the porous layer 12.

(2) Separation Using Gas

A stream of gas such as air or nitrogen gas was ejected to the gap at the outer peripheral portion of the bonded substrate stack, thereby separating the bonded substrate stack into two substrates at the porous layer 12.

(3) Separation Using Wedge

A thin wedge of, e.g., a resin was gradually inserted into the gap at the outer peripheral portion of the bonded substrate stack, thereby separating the bonded substrate stack into two substrates at the porous layer 12.

(4) Separation by Peeling

One surface of the bonded substrate stack was fixed, and the other surface was pulled in the axial direction of the bonded substrate stack using a flexible tape or the like, thereby separating the bonded substrate stack at the porous layer 12.

(5) Separation Using Shearing Stress

One surface of the bonded substrate stack was fixed, and a force was applied to the other surface to move the other surface in the planar direction of the bonded substrate stack, thereby separating the bonded substrate stack into two substrates at the porous layer 12.

(6) Separation Using Ultrasonic Wave

The bonded substrate stack was dipped in a liquid, and an ultrasonic wave was applied to the bonded substrate stack through the liquid to break the porous layer 12, thereby separating the bonded substrate stack into two substrates at the porous layer 12.

(7) Separation By Pressing

Pressure was applied to the bonded substrate stack to break the porous layer 12, thereby separating the bonded substrate stack into two substrates at the porous layer 12.

A porous layer 12b remaining on a second substrate 20' after separation was selectively etched using a solution mixture of 49% hydrofluoric acid, 30% hydrogen peroxide, and water as an etchant (FIG. 1F). With this process, an SOI substrate as shown in FIG. 1F was obtained. At this time, the surface of a single-crystal Si layer 13a functions as an etching stopper. The etching rate for single-crystal Si by this etchant is much lower than that for porous Si, and the selectivity ratio reaches $10^5$ or more. Hence, the three-dimensional pattern on the surface of the single-crystal Si layer 13a by etching can be neglected in practical use. When the film thickness of the single-crystal Si layer 13a after etching the porous layer 12b was measured at 100 points on the entire surface. The film thickness variation was ±3%. The porous layer 12b may be removed by polishing.

The resultant SOI substrate was annealed in hydrogen at 1,100° C. for 1 hr to planarize the surface. Instead of or in addition to this annealing, polishing may be performed to planarize the surface of the single-crystal Si substrate 11. The surface roughness of the single-crystal Si substrate 11 was evaluated with an atomic force microscope.

The mean square roughness in a 50-μm square area was approximately 0.2 nm. This nearly equals that of a commercially available Si substrate. Section observation with a transmission electron microscope revealed no new crystal defects in the single-crystal Si layer 13a, indicating that satisfactory crystallinity was maintained.

A $SiO_2$ layer 14b at the outer peripheral portion on the single-crystal Si substrate 11 of a first substrate 10' after separation was selectively etched using hydrofluoric acid or buffered hydrofluoric acid as an $SiO_2$ etchant (FIG. 1G). At this time, the etching amount of the porous Si layer 12a was very small. Even after the $SiO_2$ layer 14b at the outer peripheral portion was completely removed, and the underlying porous layer 12a at the outer peripheral portion was exposed, the porous layer 12a having a sufficient thickness was left.

Even when the $SiO_2$ layer 14b at the outer peripheral portion was removed by dry etching, the $SiO_2$ layer 14b could be selectively removed, as in wet etching. In dry etching, the $SiO_2$ layer at the outer peripheral portion can be selectively etched not only by adjusting the gas species, pressure, power, and discharge matching but also by controlling the distribution of the etching rates.

The porous layer 12a remaining on the single-crystal Si substrate 11 was selectively etched using a solution mixture of 49% hydrofluoric acid, 30% hydrogen peroxide, and water as an etchant (FIG. 1H). At this time, the surface of the single-crystal Si substrate 11 functions as an etching stopper. The etching rate for single-crystal Si by this etchant is much lower than that for porous Si, and the selectivity ratio reaches $10^5$ or more. Hence, the three-dimensional pattern on the surface of the single-crystal Si substrate 11 by etching can be neglected in practical use. The porous layer 12a may be removed by polishing.

The single-crystal Si substrate 11 was annealed in hydrogen at 1,100° C. for 1 hr to planarize the surface.

Instead of or in addition to this annealing, polishing may be performed to planarize the surface of the single-crystal Si substrate 11. The surface roughness of the single-crystal Si substrate 11 was evaluated with an atomic force microscope. The mean square roughness in a 50-μm square area was approximately 0.2 nm. This nearly equals that of a commercially available Si substrate. The obtained single-crystal Si substrate 11 could be reused as a substrate used to form a first substrate, or a second substrate.

Not the single-crystal Si layer 13 but another Si layer such as a polysilicon layer or an amorphous Si layer may be formed. Alternatively, a Ge layer, SiGe layer, SiC layer, C layer, or a compound semiconductor (e.g., GaAs, InP, or GaN) layer may be formed.

As the second substrate 20, not only a single-crystal Si substrate but also a substrate having an oxide film on its surface, an insulating substrate (e.g., a quartz substrate), or a transparent substrate (e.g., a quartz substrate) may be employed.

When substrates having different thermal expansion coefficients are employed as the substrate 11 used to form the first substrate, and the second substrate 20 (for example, when an Si substrate is employed as the substrate 11, and a quartz substrate is employed as the second substrate 20), the surfaces of the two substrates are preferably subjected to a plasma treatment and washed with water before bonding the two substrates. With this process, when the two substrates are stacked and annealed at a low temperature, a sufficient bonding strength can be obtained.

Example 2

Example 2 provides a modification of Example 1.

In Example 2, in the step shown in FIG. 1A, a porous layer 12 having two porous layers with different porosities was formed by anodizing in two steps. The anodizing conditions for forming the porous layer 12 with the two-layered structure in Example 2 were as follows. The porous layer 12 may have a multilayered structure with three or more layers.

<First Anodizing Conditions>
Current density: 7 ($mA/cm^2$)
Anodizing solution: $HF:H_2O:C_2H_5OH=1:1:1$
Process time: 11 (min)
Porous Si thickness: 12 ($\mu m$)

<Second Anodizing Conditions>
Current density: 21 ($mA/cm^2$)
Anodizing solution: $HF:H_2O:C_2H_5OH=1:1:1$
Process time: 2 (min)
Porous Si thickness: 3 ($\mu m$)

The remaining processes were the same as in Example 1.

Example 3

Example 3 provides a specific example of the second embodiment.

First, to form a first substrate 10, an 8-inch single-crystal Si substrate 11 was prepared. The single-crystal Si substrate 11 was anodized in an HF solution in two steps to form a porous layer 12 having a multilayered structure on the surface (FIG. 1A). The anodizing conditions were as follows.

<First Anodizing Conditions>
Current density: 7 ($mA/cm^2$)
Anodizing solution: $HF:H_2O:C_2H_5OH=1:1:1$
Process time: 5 (min)
Porous Si thickness: 5.5 ($\mu m$)

<Second Anodizing Conditions>
Current density: 7 ($mA/cm^2$)
Anodizing solution: $HF:H_2O:C_2H_5OH=1:1:1$
Process time: 1.3 (min)
Porous Si thickness: 3 ($\mu m$)

A 0.3-$\mu m$ thick single-crystal Si layer 13 was epitaxially grown on the porous Si layer 12 by CVD (Chemical Vapor Deposition) (FIG. 1B). The growth conditions were as follows. At the early stage of epitaxial growth, the surface of the porous Si layer 12 was exposed to $H_2$. Hence, holes on the surface were filled to form a flat surface.

<Epitaxial Growth Conditions>
Source gas: $SiH_2Cl_2/H_2$
Gas flow rate: 0.5/180 (1/min)
Gas pressure: 80 (Torr)
Temperature: 950 (° C.)
Growth rate: 0.30 ($\mu m/min$)

A 200-nm thick $SiO_2$ layer 14 was formed on the surface of the epitaxially grown single-crystal Si layer 13 by thermal oxidation (FIG. 1B).

The surface of the $SiO_2$ layer 14 was brought into tight contact with the surface of an independently prepared 8-inch Si substrate (second substrate) 20 to form a bonded substrate stack (FIG. 1C). The bonded substrate stack was thermally oxidized at 1,100° C. for 1 hr (FIG. 2A).

With this thermal oxidation, at the outer peripheral portion of the bonded substrate stack, the porous layer 12 was oxidized and thinned, and the outer peripheral portion of the bonded substrate stack was covered with the $SiO_2$ layer. The outer peripheral edge of the contact interface between the first substrate 10 and the second substrate 20 was located inward from the outer peripheral edge of the bonded substrate stack by about 1 mm.

The bonded substrate stack after thermal oxidation was separated into two substrates at the porous layer 12 (FIG. 2B). A second substrate 20' after separation had a multi-layered structure of a porous Si layer 12b'/single-crystal Si layer 13b'/insulating layer 14c'/single-crystal Si substrate 20. A first substrate 10' after separation had a structure in which a porous layer 12a' having a thickness of about 3 $\mu m$ was formed on the single-crystal Si substrate 11, and a single-crystal Si layer 13c' and insulating layer 14b' were sequentially formed at the outer peripheral portion on the porous layer 12a'.

As a separating method, for example, the following methods were preferable.

(1) Separation by Water Jet Method

A water jet having a diameter of, e.g., about 0.2 mm was ejected to the gap at the outer peripheral portion of the bonded substrate stack, thereby separating the bonded substrate stack into two substrates at the porous layer 12.

(2) Separation Using Gas

A stream of gas such as air or nitrogen gas was ejected to the gap at the outer peripheral portion of the bonded substrate stack, thereby separating the bonded substrate stack into two substrates at the porous layer 12.

(3) Separation Using Wedge

A thin wedge of, e.g., a resin was gradually inserted into the gap at the outer peripheral portion of the bonded substrate stack, thereby separating the bonded substrate stack into two substrates at the porous layer 12.

(4) Separation by Peeling

One surface of the bonded substrate stack was fixed, and the other surface was pulled in the axial direction of the bonded substrate stack using a flexible tape or the like, thereby separating the bonded substrate stack at the porous layer.

(5) Separation Using Shearing Stress

One surface of the bonded substrate stack was fixed, and a force was applied to the other surface to move the other surface in the planar direction of the bonded substrate stack, thereby separating the bonded substrate stack into two substrates at the porous layer 12.

(6) Separation Using Ultrasonic Wave

The bonded substrate stack was dipped in a liquid, and an ultrasonic wave was applied to the bonded substrate stack through the liquid to break the porous layer 12, thereby separating the bonded substrate stack into two substrates at the porous layer 12.

(7) Separation By Pressing

Pressure was applied to the bonded substrate stack to break the porous layer 12, thereby separating the bonded substrate stack into two substrates at the porous layer 12.

A porous layer 12b remaining on a second substrate 20' after separation was selectively etched using a solution mixture of 49% hydrofluoric acid, 30% hydrogen peroxide, and water as an etchant (FIG. 2C). With this process, an SOI substrate as shown in FIG. 2C was obtained. At this time, the surface of a single-crystal Si layer 13a functions as an etching stopper. The etching rate for single-crystal Si by this etchant is much lower than that for porous Si, and the selectivity ratio reaches $10^5$ or more. Hence, the three-dimensional pattern on the surface of the single-crystal Si layer 13b' by etching can be neglected in practical use. When the film thickness of the single-crystal Si layer 13b' after etching the porous layer 12b' was measured at 100 points on the entire surface. The film thickness variation was ±3%. The porous layer 12b' may be removed by polishing.

The resultant SOI substrate was annealed in hydrogen at 1,100° C. for 1 hr to planarize the surface. Instead of or in addition to this annealing, polishing may be performed to planarize the surface of the single-crystal Si substrate 11. The surface roughness of the single-crystal Si substrate 11 was evaluated with an atomic force microscope. The mean square roughness in a 50-μm square area was approximately 0.2 nm. This nearly equals that of a commercially available Si substrate. Section observation with a transmission electron microscope revealed no new crystal defects in the single-crystal Si layer 13b', indicating that satisfactory crystallinity was maintained.

A $SiO_2$ layer 14b' at the outer peripheral portion on the single-crystal Si substrate 11 of the first substrate 10' after separation was selectively etched using hydrofluoric acid or buffered hydrofluoric acid as an $SiO_2$ etchant (FIG. 2D). At this time, the etching amount of the porous Si layer 12a' was very small. Even after the $SiO_2$ layer 14b' at the outer peripheral portion was completely removed, and the underlying single-crystal Si layer 13c' was exposed, the porous layer 12a' having a sufficient thickness was left.

The single-crystal Si layer 13c' remaining at the outer peripheral portion on the porous layer 12a' was removed using a solution mixture of hydrofluoric acid, nitric acid, and acetic acid as an etchant (mixing ratio=1:100:100) as an etchant (FIG. 2E). The porous Si layer 12a' is also etched simultaneously with etching the single-crystal Si layer 13c' at the outer peripheral portion. However, the etching amount of the porous Si layer 12a' can be neglected. More specifically, in Example 3, the single-crystal Si layer 13c' at the outer peripheral portion had a thickness of about 0.2 μm. When the single-crystal Si layer 13c' was completely removed, the etching amount of the porous Si layer 12a' was about 0.3 μm at maximum. As described above, the thickness of the porous Si layer 12a' was about 3 μm.

Even when at least one of the $SiO_2$ layer 14b' and single-crystal Si layer 13c' at the outer peripheral portion was removed by dry etching, the $SiO_2$ layer 14b' and/or single-crystal Si layer 13c' could be selectively removed, as in wet etching. In dry etching, the $SiO_2$ layer and/or single-crystal Si layer at the outer peripheral portion can be selectively etched not only by adjusting the gas species, pressure, power, and discharge matching but also by controlling the distribution of the etching rates.

The porous layer 12a' remaining on the single-crystal Si substrate 11 was selectively etched using a solution mixture of 49% hydrofluoric acid, 30% hydrogen peroxide, and water as an etchant (FIG. 2F). At this time, the surface of the single-crystal Si substrate 11 functions as an etching stopper. The etching rate for single-crystal Si by this etchant is much lower than that for porous Si, and the selectivity ratio reaches $10^5$ or more. Hence, the three-dimensional pattern on the surface of the single-crystal Si substrate 11 by etching can be neglected in practical use. The porous layer 12a' may be removed by polishing.

The single-crystal Si substrate 11 was annealed in hydrogen at 1,100° C. for 1 hr to planarize the surface. Instead of or in addition to this annealing, polishing may be performed to planarize the surface of the single-crystal Si substrate 11. The surface roughness of the single-crystal Si substrate 11 was evaluated with an atomic force microscope. The mean square roughness in a 50-μm square area was approximately 0.2 nm. This nearly equals that of a commercially available Si substrate. The obtained single-crystal Si substrate 11 could be reused as a substrate used to form a first substrate, or a second substrate.

Not the single-crystal Si layer 13 but another Si layer such as a polysilicon layer or an amorphous Si layer may be formed. Alternatively, a Ge layer, SiGe layer, SiC layer, C layer, or a compound semiconductor (e.g., GaAs, InP, or GaN) layer may be formed.

As the second substrate 20, not only a single-crystal Si substrate but also a substrate having an oxide film on its surface, an insulating substrate (e.g., a quartz substrate), or a transparent substrate (e.g., a quartz substrate) may be employed.

When substrates having different thermal expansion coefficients are employed as the substrate 11 used to form the first substrate, and the second substrate 20 (for example, when an Si substrate is employed as the substrate 11, and a quartz substrate is employed as the second substrate 20), the surfaces of the two substrates are preferably subjected to a plasma treatment and washed with water before bonding the two substrates. With this process, when the two substrates are stacked and annealed at a low temperature, a sufficient bonding strength can be obtained.

Example 4

In Examples 1 to 3, a first substrate 10 and second substrate 20 were bonded to form a bonded substrate stack. Instead of separating the bonded substrate stack at the porous layer, a flexible film was bonded to the surface of the first substrate 10. After that, the first substrate 10 was separated at the porous layer, thereby transferring a single-crystal Si layer and insulating layer formed on the porous layer of the first substrate 10 to the film. After that, the first substrate after separation was recycled according to Examples 1 to 3.

Example 5

Example 5 provides a specific example of an SOI substrate manufacturing method and method of recycling the first substrate when a porous layer (microcavity layer) is formed not by anodizing but by ion implantation.

First, a 200-nm thick $SiO_2$ layer was formed on the surface of a single-crystal Si substrate by thermal oxidation. Hydrogen ions were implanted into the substrate through the $SiO_2$ layer at 40 keV and $5 \times 10^{16}$ $cm^{-2}$. For example, an ion implantation apparatus using a beam or a batch implantation plasma apparatus using a plasma can be applied to this ion implantation process. With this ion implantation, a substrate identical to a first substrate 10 shown in FIG. 1B, i.e., a substrate sequentially having a porous layer (ion implantation layer or microcavity layer) 12, single-crystal Si layer 13, and $SiO_2$ layer on a single-crystal Si substrate 11 was formed.

The surface of an $SiO_2$ layer 14 of the first substrate 10 was brought into tight contact with the surface of an independently prepared 8-inch Si substrate (second substrate) 20, and the resultant structure was annealed at 400° C. to 600° C. to increase the bonding strength. With this process, a bonded substrate stack as shown in FIG. 1C was obtained. The outer peripheral edge of the contact interface between the first substrate 10 and the second substrate 20 was located inward from the outer peripheral edge of the bonded substrate stack by about 1.5 mm.

Figure 3:
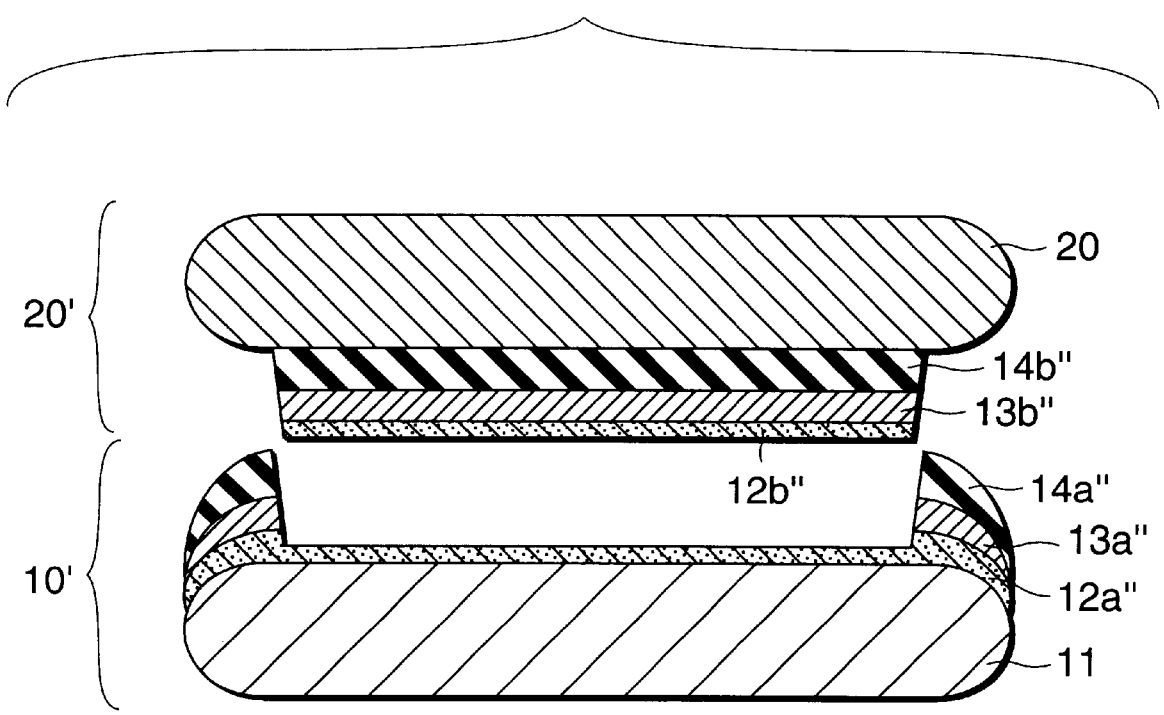
FIG. 3 is a view schematically showing the process of separating, at a porous layer, a bonded substrate stack formed by bonding to a second substrate a first substrate on which the porous layer (microcavity layer) is formed by ion implantation.

The bonded substrate stack was separated. As shown in FIG. 3, a first substrate 10' and second substrate 20' after separation were obtained. As the separating method, not only the methods described in Example 1 but also a method of oxidizing the porous layer (microcavity layer) 12 from the outer peripheral portion at a high speed to increase the volume and using the expanded portion as a king of wedge can also be effectively used.

The second substrate 20' after separation had a multilayered structure of a porous layer 12b"/single-crystal Si layer 13b"/insulating layer 14b"/single-crystal Si substrate 20. The first substrate 10' after separation had a structure in which a porous layer 12a" was formed on the single-crystal Si substrate 11, and a single-crystal Si layer 13a" and insulating layer 14" were sequentially formed at the outer peripheral portion (e.g., a portion about 1.5 mm from the outer peripheral edge toward the inside) on the porous layer 12a". There was a region where the porous layer 12a" at the outer peripheral portion cracked to peel the upper layer.

A porous layer 12b" remaining on a second substrate 20' after separation was selectively etched using a solution mixture of 49% hydrofluoric acid, 30% hydrogen peroxide, and water as an etchant, and an SOI substrate was obtained. At this time, the surface of a single-crystal Si layer 13b" functions as an etching stopper. The etching rate for single-crystal Si by this etchant is much lower than that for porous Si, and the selectivity ratio reaches $10^5$ or more. Hence, the three-dimensional pattern on the surface of the single-crystal Si layer 13b" by etching can be neglected in practical use. When the film thickness of the single-crystal Si layer 13b" after etching the porous layer 12b" was measured at 100 points on the entire surface. The film thickness variation was ±3%. The porous layer 12b" may be removed by polishing.

The resultant SOI substrate was annealed in hydrogen at 1,100° C. for 1 hr to planarize the surface. Instead of or in addition to this annealing, polishing may be performed to planarize the surface of the single-crystal Si substrate 11. The surface roughness of the single-crystal Si substrate 11 was evaluated with an atomic force microscope. The mean square roughness in a 50-μm square area was approximately 0.2 nm. This nearly equals that of a commercially available Si substrate. Section observation with a transmission electron microscope revealed no new crystal defects in the single-crystal Si layer 13a, indicating that satisfactory crystallinity was maintained.

A $SiO_2$ layer 14a" remaining on the surface at the outer peripheral portion of the first substrate 10' after separation was selectively etched using hydrofluoric acid or buffered hydrofluoric acid as an $SiO_2$ etchant. At this time, the etching amount of the porous Si layer 12a" was very small. Even after the $SiO_2$ layer 14a" at the outer peripheral portion was completely removed, and the underlying single-crystal Si layer 13a" was exposed, the porous layer 12a" having a sufficient thickness was left.

The single-crystal Si layer 13a" remaining at the outer peripheral portion on the porous layer 12a" was removed using a solution mixture of hydrofluoric acid, nitric acid, and acetic acid as an etchant (mixing ratio=1:100:100) as an etchant. The porous Si layer 12a" is also etched simultaneously with etching the single-crystal Si layer 13a" at the outer peripheral portion. However, the etching amount of the porous Si layer 12a" can be neglected. More specifically, in Example 5, the single-crystal Si layer 13a" at the outer peripheral portion had a thickness of about 0.2 μm. When the single-crystal Si layer 13a" was completely removed, the etching amount of the porous Si layer 12a" was about 0.3 μm at maximum.

Even when at least one of the $SiO_2$ layer 14a" and single-crystal Si layer 13a" at the outer peripheral portion was removed by dry etching, the $SiO_2$ layer 14a' and/or single-crystal Si layer 13a" could be selectively removed, as in wet etching. In dry etching, the $SiO_2$ layer and/or single-crystal Si layer at the outer peripheral portion can be selectively etched not only by adjusting the gas species, pressure, power, and discharge matching but also by controlling the distribution of the etching rates.

The porous layer 12a" remaining on the single-crystal Si substrate 11 was selectively etched using a solution mixture of 49% hydrofluoric acid, 30% hydrogen peroxide, and water as an etchant. At this time, the surface of the single-crystal Si substrate 11 functions as an etching stopper. The etching rate for single-crystal Si by this etchant is much lower than that for porous Si, and the selectivity ratio reaches $10^5$ or more. Hence, the three-dimensional pattern on the surface of the single-crystal Si substrate 11 by etching can be neglected in practical use. The porous layer 12a" may be removed by polishing.

The single-crystal Si substrate 11 was annealed in hydrogen at 1,100° C. for 1 hr to planarize the surface. Instead of or in addition to this annealing, polishing may be performed to planarize the surface of the single-crystal Si substrate 11. The surface roughness of the single-crystal Si substrate 11 was evaluated with an atomic force microscope. The mean square roughness in a 50-μm square area was approximately 0.2 nm. This nearly equals that of a commercially available Si substrate. The obtained single-crystal Si substrate 11 could be reused as a substrate used to form a first substrate, or a second substrate.

As the second substrate 20, not only a single-crystal Si substrate but also a substrate having an oxide film on its surface, an insulating substrate (e.g., a quartz substrate), or a transparent substrate (e.g., a quartz substrate) may be employed.

When substrates having different thermal expansion coefficients are employed as the substrate 11 used to form the first substrate, and the second substrate 20 (for example, when an Si substrate is employed as the substrate 11, and a quartz substrate is employed as the second substrate 20), the surfaces of the two substrates are preferably subjected to a plasma treatment and washed with water before bonding the two substrates. With this process, when the two substrates are stacked and annealed at a low temperature, a sufficient bonding strength can be obtained.

Example 6

Example 6 provides a modification of Example 5.

More specifically, in Example 6, a 0.3-μm thick single-crystal Si layer was formed on a single-crystal Si substrate by CVD (Chemical Vapor Deposition). After that, the process of forming an $SiO_2$ layer on the surface of the substrate and subsequent processes were executed in accordance with Example 4. The growth conditions were as follows.
<Epitaxial Growth Conditions>
  Source gas: $SiH_2Cl_2/H_2$
  Gas flow rate: 0.5/180 (1/min)
  Gas pressure: 80 (Torr)
  Temperature: 950 (° C.)
  Growth rate: 0.30 (μm/min)

Example 7

Example 7 provides a specific example of an SOI substrate manufacturing method and method of recycling the first substrate when a porous layer (microcavity layer) is formed not by anodizing but by ion implantation. First, a 200-nm thick $SiO_2$ layer was formed on the surface of a single-crystal Si substrate by thermal oxidation. Hydrogen ions were implanted into the substrate through the $SiO_2$ layer at 40 keV and $5 \times 10^{16}$ cm$^{-2}$. For example, an ion implantation apparatus using a beam or a batch implantation plasma apparatus using a plasma can be applied to this ion implantation process. With this ion implantation, a substrate identical to a first substrate 10 shown in FIG. 1B, i.e., a substrate sequentially having a porous layer (ion implantation layer or microcavity layer) 12, single-crystal Si layer 13, and $SiO_2$ layer on a single-crystal Si substrate 11 was formed.

The surface of an $SiO_2$ layer 14 of the first substrate 10 and the surface of an independently prepared 8-inch Si substrate (second substrate) 20 were subjected to a nitrogen plasma treatment and washed with water. After that, the surfaces of the two substrates were brought into tight contact with each other. The two substrates had a sufficient bonding strength by the nitrogen plasma treatment. However, annealing at about 200° C. may be executed to further increase the bonding strength. With this process, a bonded substrate stack as shown in FIG. 1C was obtained. The outer peripheral edge of the contact interface between the first substrate 10 and the second substrate 20 was located inward from the outer peripheral edge of the bonded substrate stack by about 1.5 mm.

The bonded substrate stack was separated. As shown in FIG. 3, a first substrate 10' and second substrate 20' after separation were obtained. As the separating method, not only the methods described in Example 1 but also a method of oxidizing the porous layer (microcavity layer) 12 from the outer peripheral portion at a high speed to increase the volume and using the expanded portion as a king of wedge can also be effectively used.

The second substrate 20' after separation had a multilayered structure of a porous layer 12b"/single-crystal Si layer 13b"/insulating layer 14b"/single-crystal Si substrate 20. The first substrate 10' after separation had a structure in which a porous layer 12a" was formed on the single-crystal Si substrate 11, and a single-crystal Si layer 13a" and insulating layer 14" were sequentially formed at the outer peripheral portion (e.g., a portion about 1.5 mm from the outer peripheral edge toward the inside) on the porous layer 12a". There was a region where the porous layer 12a" at the outer peripheral portion cracked to peel the upper layer.

A porous layer 12b" remaining on a second substrate 20' after separation was selectively etched using a solution mixture of 49% hydrofluoric acid, 30% hydrogen peroxide, and water as an etchant, and an SOI substrate was obtained. At this time, the surface of a single-crystal Si layer 13b" functions as an etching stopper. The etching rate for single-crystal Si by this etchant is much lower than that for porous Si, and the selectivity ratio reaches $10^5$ or more. Hence, the three-dimensional pattern on the surface of the single-crystal Si layer 13b" by etching can be neglected in practical use. When the film thickness of the single-crystal Si layer 13b" after etching the porous layer 12b" was measured at 100 points on the entire surface. The film thickness variation was ±3%. The porous layer 12b" may be removed by polishing.

The resultant SOI substrate was annealed in hydrogen at 1,100° C. for 1 hr to planarize the surface. Instead of or in addition to this annealing, polishing may be performed to planarize the surface of the single-crystal Si substrate 11. The surface roughness of the single-crystal Si substrate 11 was evaluated with an atomic force microscope. The mean square roughness in a 50-μm square area was approximately 0.2 nm. This nearly equals that of a commercially available Si substrate. Section observation with a transmission electron microscope revealed no new crystal defects in the single-crystal Si layer 13a, indicating that satisfactory crystallinity was maintained.

A $SiO_2$ layer 14a" remaining on the surface at the outer peripheral portion of the first substrate 10' after separation was selectively etched using hydrofluoric acid or buffered hydrofluoric acid as an $SiO_2$ etchant. At this time, the etching amount of the porous Si layer 12a" was very small. Even after the $SiO_2$ layer 14a" at the outer peripheral portion was completely removed, and the underlying single-crystal Si layer 13a" was exposed, the porous layer 12a" having a sufficient thickness was left.

The single-crystal Si layer 13a" remaining at the outer peripheral portion on the porous layer 12a" was removed using a solution mixture of hydrofluoric acid, nitric acid, and acetic acid as an etchant (mixing ratio=1:100:100) as an etchant. The porous Si layer 12a" is also etched simultaneously with etching the single-crystal Si layer 13a" at the outer peripheral portion. However, the etching amount of the porous Si layer 12a" can be neglected. More specifically, in Example 7, the single-crystal Si layer 13a" at the outer peripheral portion had a thickness of about 0.2 μm. When the single-crystal Si layer 13a" was completely removed, the etching amount of the porous Si layer 12a" was about 0.3 μm at maximum.

Even when at least one of the $SiO_2$ layer 14a" and single-crystal Si layer 13a" at the outer peripheral portion was removed by dry etching, the $SiO_2$ layer 14a" and/or single-crystal Si layer 13a" could be selectively removed, as in wet etching. In dry etching, the $SiO_2$ layer and/or single-crystal Si layer at the outer peripheral portion can be selectively etched not only by adjusting the gas species, pressure, power, and discharge matching but also by controlling the distribution of the etching rates.

The porous layer 12a" remaining on the single-crystal Si substrate 11 was selectively etched using a solution mixture of 49% hydrofluoric acid, 30% hydrogen peroxide, and water as an etchant. At this time, the surface of the single-crystal Si substrate 11 functions as an etching stopper. The etching rate for single-crystal Si by this etchant is much lower than that for porous Si, and the selectivity ratio reaches $10^5$ or more. Hence, the three-dimensional pattern on the surface of the single-crystal Si substrate 11 by etching can be neglected in practical use. The porous layer 12a" may be removed by polishing.

The single-crystal Si substrate 11 was annealed in hydrogen at 1,100° C. for 1 hr to planarize the surface. Instead of or in addition to this annealing, polishing may be performed to planarize the surface of the single-crystal Si substrate 11. The surface roughness of the single-crystal Si substrate 11 was evaluated with an atomic force microscope. The mean square roughness in a 50-μm square area was approximately 0.2 nm. This nearly equals that of a commercially available Si substrate. The obtained single-crystal Si substrate 11 could be reused as a substrate used to form a first substrate, or a second substrate.

As the second substrate 20, not only a single-crystal Si substrate but also a substrate having an oxide film on its surface, an insulating substrate (e.g., a quartz substrate), or a transparent substrate (e.g., a quartz substrate) may be employed.

When substrates having different thermal expansion coefficients are employed as the substrate 11 used to form the first substrate, and the second substrate 20 (for example, when an Si substrate is employed as the substrate 11, and a quartz substrate is employed as the second substrate 20), the surfaces of the two substrates are preferably subjected to a plasma treatment and washed with water before bonding the two substrates. With this process, when the two substrates are stacked and annealed at a low temperature, a sufficient bonding strength can be obtained.

Others

In the above examples, to grow the first layer on the porous layer, not only CVD but also various methods such as MBE, sputtering, and liquid phase growth can be employed.

In the above examples, as the etchant used for selective etching of the porous Si layer, not only the solution mixture of 49% hydrofluoric acid, 30% hydrogen peroxide, and water but also various etchants such as a) a solution mixture of hydrofluoric acid and water,
b) a solution mixture prepared by adding at least one of an alcohol and hydrogen peroxide to a solution mixture of hydrofluoric acid and water,
c) buffered hydrofluoric acid,
d) a solution mixture prepared by adding at least one of an alcohol and hydrogen peroxide to buffered hydrofluoric acid, and
e) a solution mixture of hydrofluoric acid, nitric acid, and acetic acid can be employed.

According to the present invention, for example, the first substrate after separation of a bonded substrate stack can easily be planarized.

The present invention is not limited to the above embodiments and various changes and modifications can be made within the spirit and scope of the present invention. Therefore, to apprise the public of the scope of the present invention, the following claims are made.

What is claimed is:

1. A processing method of processing a used first substrate that remains after a bonded substrate stack is formed by bonding a first substrate having a separation layer and a transfer layer on said separation layer to a second substrate, and said bonded substrate stack is separated mainly at said separation layer to transfer a partial region of said transfer layer to said second substrate, comprising:

the transfer layer removal step of selectively removing said transfer layer remaining on said used first substrate thereby leaving only the separation layer on said used first substrate; and the separation layer removal step of selectively removing said separation layer remaining on a surface of said used first substrate thereby maintaining the surface planarity of said used first substrate.

2. The method according to claim 1, wherein the transfer layer removal step comprises selectively removing said transfer layer remaining on an upper surface of said used first substrate.

3. The method according to claim 1, wherein said transfer layer remaining on said used first substrate is present at at least an outer peripheral portion of an upper surface of said first substrate.

4. The method according to claim 1, wherein said transfer layer remaining on said used first substrate is present at at least an outer peripheral portion and edge portion of an upper surface of said first substrate.

5. The method according to claim 1, wherein said transfer layer remaining on said used first substrate is present at at least an outer peripheral portion and edge portion of upper and lower surfaces of said first substrate.

6. The method according to claim 1, wherein said transfer layer remaining on said used first substrate is present at at least an outer peripheral portion and edge portion of an upper surface and on a lower surface of said first substrate.

7. The method according to claim 1, wherein said transfer layer sequentially has a first layer and a second layer on said separation layer, and the transfer layer removal step comprises:

the first step of removing said second layer remaining on said used first substrate; and the second step of removing said first layer remaining on said used first substrate.

8. The method according to claim 1, wherein said transfer layer includes a semiconductor layer.

9. The method according to claim 1, wherein said transfer layer includes an Si layer.

10. The method according to claim 1, wherein said transfer layer includes a single-crystal Si layer.

11. The method according to claim 7, wherein said first layer is a single-crystal Si layer, and said second layer is an $SiO_2$ layer.

12. The method according to claim 1, wherein said transfer layer includes at least one of a Ge layer, an SiGe layer, an SiC layer, and a C layer.

13. The method according to claim 1, wherein said transfer layer includes a compound semiconductor layer.

14. The method according to claim 1, wherein said separation layer is a porous layer.

15. The method according to claim 1, wherein said first substrate has, as said separation layer, a porous layer obtained by anodizing a surface of a single-crystal Si substrate, and said transfer layer on said porous layer.

16. The method according to claim 1, wherein said first substrate has, as said separation layer, a porous layer obtained by implanting ions into a single-crystal Si substrate, and said transfer layer on said porous layer.

17. The method according to claim 1, wherein said first substrate is prepared by forming said separation layer and said transfer layer on an Si substrate.

18. The method according to claim 1, wherein said second substrate is one of an Si substrate, an Si substrate having an oxide film, a transparent substrate, and an insulating substrate.

19. The method according to claim 9, wherein the transfer layer removal step comprises etching said transfer layer remaining on said used first substrate using a solution containing hydrofluoric acid.

20. The method according to claim 11, wherein the first step comprises etching the single-crystal Si layer as said first layer using one of hydrofluoric acid and buffered hydrofluoric acid.

21. The method according to claim 11, wherein the second step comprises etching the $SiO_2$ layer as said second layer using a solution mixture of hydrofluoric acid, acetic acid, and nitric acid.

22. The method according to claim 1, wherein the transfer layer removal step comprises etching said transfer layer remaining on said used first substrate by dry etching.

23. The method according to claim 1, wherein the separation layer removal step comprises selectively removing said separation layer.

24. The method according to claim 1, wherein the separation layer removal step comprises selectively removing said separation layer by wet etching.

25. The method according to claim 24, wherein as an etchant, one material selected from the group consisting of hydrofluoric acid,
a solution mixture prepared by adding at least one of an alcohol and hydrogen peroxide to hydrofluoric acid,
buffered hydrofluoric acid, and
a solution mixture prepared by adding at least one of an alcohol and hydrogen peroxide to buffered hydrofluoric acid is used.

26. The method according to claim 1, wherein the separation layer removal step comprises selectively removing said separation layer by polishing.

27. The method according to claim 1, further comprising the planarization step of planarizing an upper surface of said used first substrate after the separation layer removal step.

28. The method according to claim 27, wherein the planarization step comprises the step of annealing the upper surface of said used first substrate in an atmosphere containing hydrogen.

29. The method according to claim 27, wherein the planarization step comprises the step of planarizing the upper surface of said used first substrate by polishing.

30. A processing method of processing a used substrate that remains after a transfer layer of a substrate having a separation layer and said transfer layer on said separation layer is transferred to another object, comprising:
the transfer layer removal step of selectively removing said transfer layer remaining on said used substrate thereby leaving only the separation layer on said used substrate; and
the separation layer removal step of selectively removing said separation layer remaining on a surface of said used substrate thereby maintaining the surface planarity of said used substrate.

31. A processing method of removing a porous layer and other layers from a substrate having said porous layer and said other layers at a outer peripheral portion of said porous layer, comprising the steps of:
selectively removing said other layers thereby leaving only said porous layer on the substrate; and
seletvely removing said porous layer thereby maintaining the surface planarity of the substrate.

32. A method of manufacturing semiconductor substrates, comprising:
the preparation step of bonding a first substrate having a separation layer and, on said separation layer, a transfer layer including a semiconductor layer to an independently prepared second substrate to prepare a bonded substrate stack;
the transfer step of separating said bonded substrate stack mainly at said separation layer to transfer a partial region of said transfer layer to a surface of said second substrate, thereby preparing a semiconductor substrate having said transfer layer on a surface;
the transfer layer removal step of selectively removing said transfer layer remaining on said first substrate after the transfer step thereby leaving only the separation layer on said first substrate; and
the separation layer removal step of selectively removing said separation layer remaining on the surface of said first substrate after the transfer layer removal step thereby maintaining the surface planarity of said first substrate,
wherein the semiconductor substrates are obtained while executing a series of processes of reusing said first substrate after the separation layer removal step as a material used to prepare a bonded substrate stack in the preparation step.

33. A method of producing recycled substrate by recycling a used first substrate that remains after a bonded substrate stack is formed by bonding a first substrate having a separation layer and a transfer layer on said separation layer to a second substrate, and said bonded substrate stack is separated mainly at said separation layer to transfer a primary region of said transfer layer to said second substrate, comprising the steps of:
selectively removing said transfer layer remaining on said used first substrate thereby leaving only the separation layer on said used first substrate; and then
selectively removing said separation layer remaining on a surface of said used first substrate thereby producing said cycled substrate that has a planar surface.

34. A method of producing a recycled substrate by recycling a used substrate that remains after a transfer layer of a substrate having a separation layer and said transfer layer on said separation layer is transferred to another object, comprising the steps of:
selectively removing said transfer layer remaining on said used substrate thereby leaving only the separation layer on said used substrate; and then
selectively removing said separation layer remaining on a surface of said used substrate thereby producing said recycled substrate that has a planar surface.

35. A method of producing a semiconductor substrate, comprising the steps of:
bonding a first substrate of a semiconductor having a separation layer and, on said separation layer, a transfer layer to an independently prepared second substrate To prepare a bonded substrate stack;
separating said bonded substrate stack mainly at said separation layer so that a primary region of said transfer layer bonds to a surface of said second substrate and a partial region of said transfer and separation layers remains on said first substrate;
selectively removing said transfer layer remaining on said first substrate after the separation step thereby leaving only the separation layer on said first substrate; and then
selectively removing said separation layer remaining on the surface of said first substrate thereby producing said semiconductor substrate that has a planar surface.

36. The method according to claim 35, wherein said transfer layer remaining on said first substrate after the separation step consists of an oxide of a semiconductor layer.

37. The method according to claim 35, wherein said transfer layer remaining on said first substrate after the separation step includes a semiconductor layer and an oxide of the semiconductor layer.

38. A method of producing a semiconductor substrate, comprising the steps of:
bonding a first substrate of a semiconductor having a separation layer and, on said separation layer, a transfer layer including a semiconductor layer to an independently prepared second substrate to prepare a bonded substrate stack;
retreating an edge of said semiconductor layer from an edge of said bonded substrate stack by oxidizing said semiconductor layer;
separating said bonded substrate stack mainly at said separation layer so that a primary region of said transfer layer bonds to a surface of said second substrate and a partial region of said transfer and separation layers remains on said first substrate;

selectively removing said transfer layer including an oxide of said semiconductor layer and remaining on said first substrate after the separation step; and then removing said separation layer remaining on the surface of said first substrate after the transfer layer removal step thereby producing said semiconductor substrate that has a planer surface.

39. A method of producing a semiconductor substrate, comprising the steps of:

bonding a first substrate of semiconductor having a separation layer and, on said separation layer, a transfer layer including a semiconductor layer to an independently prepared second substrate to prepare a bonded substrate stack;

thinning an edge of said semiconductor layer from an edge of said bonded substrate stack by oxidizing said semiconductor layer;

separating said bonded substrate stack mainly at said separation layer so that a primary region of said transfer layer including said semiconductor layer bonds to a surface of said second substrate and a partial region of said transfer and separation layers remains on said first substrate;

selectively removing said transfer layer including an oxide of said semiconductor layer and remaining on said first substrate after the separation step; and then removing said separation layer remaining on the surface of said first substrate after the transfer layer removal step thereby producing said semiconductor substrate that has a planer surface.

* * * * *

UNITED STATES PATENT AND TRADEMARK OFFICE
CERTIFICATE OF CORRECTION

PATENT NO. : 6,426,270 B1
DATED : July 30, 2002
INVENTOR(S) : Kiyofumi Sakaguchi et al.

It is certified that error appears in the above-identified patent and that said Letters Patent is hereby corrected as shown below:

Title page,
Item [56], References Cited, OTHER PUBLICATIONS, "R.P. Holmstrom and J.Y. Chi, *Applied Phys. Letter*, "Complete Dielectric Isolation By Highly Selective and Self-S-topping Formation of Oxidized Porous Silicon", vol. 42, 386 (1983)." should read -- R.P. Holmstrom and J.Y. Chi, *Applied Phys. Letter*, "Complete Dielectric Isolation By Highly Selective and Self-Stopping Formation of Oxidized Porous Silicon", vol. 42, 386 (1983). --

Column 2,
Line 46, "$10^{16}$" should read -- $10^{18}$ --

Column 3,
Line 44, "10-μmn" should read -- 10-μm --
Line 55, "$Si+2HF+(2-n)e^{30} \rightarrow SiF_2+2H^++ne^{31}$" should read -- $Si+2HF+(2-n)e^+ \rightarrow SiF_2+2H^++ne^-$ --
Line 60, "$Si+4HF+(4-\lambda)e^+ \rightarrow SiF_4+4H^++\lambda e^{31}$" should read -- $Si+4HF+(4-\lambda)e^+ \rightarrow SiF_4+4H^++\lambda e^-$ --
Line 62, "where $e^{30}$ and $e^{31}$" should read -- where $e^+$ and $e^-$ --

Column 5,
Lines 8, 13, 18 and 23, "present at least" should read -- present at at least --

Column 11,
Line 36, "with a effect," should read -- with a defect, --

Column 12,
Line 20, "substrate tack" should read -- substrate stack --

Column 22,
Line 6, "layer 14a'" should read -- layer 14a" --

Column 27,
Line 35, "at a outer" should read -- at an outer --
Line 40, "seletvely" should read -- selectively --

UNITED STATES PATENT AND TRADEMARK OFFICE
CERTIFICATE OF CORRECTION

PATENT NO.    : 6,426,270 B1
DATED         : July 30, 2002
INVENTOR(S)   : Kiyofumi Sakaguchi et al.

It is certified that error appears in the above-identified patent and that said Letters Patent is hereby corrected as shown below:

Column 28,
Line 32, "substrate To" should read -- substrate to --

Signed and Sealed this

Eighteenth Day of February, 2003

JAMES E. ROGAN
*Director of the United States Patent and Trademark Office*